(12) United States Patent
Unokuchi et al.

(10) Patent No.: US 11,860,225 B2
(45) Date of Patent: Jan. 2, 2024

(54) METHOD OF MANUFACTURING SEMICONDUCTOR DEVICE

(71) Applicant: RENESAS ELECTRONICS CORPORATION, Tokyo (JP)

(72) Inventors: Fukumi Unokuchi, Tokyo (JP); Toshitsugu Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 82 days.

(21) Appl. No.: 17/678,307

(22) Filed: Feb. 23, 2022

(65) Prior Publication Data

US 2023/0266386 A1 Aug. 24, 2023

(51) Int. Cl.
*G01R 31/28* (2006.01)

(52) U.S. Cl.
CPC ..... *G01R 31/2887* (2013.01); *G01R 31/2879* (2013.01); *G01R 31/2893* (2013.01); *G01R 31/2896* (2013.01)

(58) Field of Classification Search
CPC ............ G01R 31/2639; G01R 31/3008; G01R 31/52; G01R 31/26
USPC .................................................... 324/756.07
See application file for complete search history.

(56) References Cited

U.S. PATENT DOCUMENTS

| 4,774,462 A * | 9/1988 | Black ................. G01R 1/07392 |
| | | 324/756.07 |
| 9,110,129 B1 * | 8/2015 | Ames ................. G01R 31/2801 |

FOREIGN PATENT DOCUMENTS

JP 2020-112398 A 7/2020

* cited by examiner

*Primary Examiner* — Jermele M Hollington
*Assistant Examiner* — Courtney G McDonnough
(74) *Attorney, Agent, or Firm* — McDermott Will & Emery LLP

(57) ABSTRACT

A test apparatus includes a test board, a unit, and a probe pin housed in the unit. First and second tip portions of the probe pin have the same shape as each other. A first external terminal of a first semiconductor package is brought into contact with the first tip portion of the probe pin and the second tip portion thereof is brought into contact with the terminal of the test board, thereby performing an electrical test of the first semiconductor package. Then, the unit is turned upside down and rearranged in the test apparatus. Thereafter, a second external terminal of a second semiconductor package is brought into contact with the second tip portion of the probe pin and the first tip portion thereof is brought into contact with the terminal of the test board, thereby performing an electrical test of the second semiconductor package.

16 Claims, 18 Drawing Sheets

METHOD OF MANUFACTURING SEMICONDUCTOR DEVICE

BACKGROUND

The present invention relates to a method of manufacturing a semiconductor device, and relates to, for example, a technique effectively applied when a semiconductor device is tested using a probe pin.

Japanese Unexamined Patent Application Publication No. 2020-112398 discloses a technique of performing an electrical test of a semiconductor device by using a socket including a ground unit having a plurality of probes.

SUMMARY

In a manufacturing process of a semiconductor device, an electrical test of the semiconductor device is performed by bringing a probe pin into contact with an external terminal of the semiconductor device in order to exclude defective products. At this time, as the probe pin comes into contact with the external terminal of the semiconductor device, the probe pin is worn away. Therefore, it is necessary to replace the worn probe pin after performing the electrical test for a certain number of semiconductor devices. However, frequent replacement of worn probe pins will be a factor in increasing the manufacturing cost of the semiconductor device.

Other objects and novel features will become apparent from the description of this specification and accompanying drawings.

According to an embodiment, a test apparatus includes a test board, a unit, and a probe pin housed in the unit. The unit has a first surface and a second surface that are located on opposite side to each other, the probe pin has a first tip portion and a second tip portion that are located on opposite side to each other, and each of the first tip portion and the second tip portion has the same shape as each other. In a state where the unit is arranged such that the second surface faces the test board, a first external terminal of a first semiconductor package is brought into contact with the first tip portion of the probe pin and the second tip portion of the probe pin is brought into contact with a terminal of the test board, thereby performing the electrical test of the first semiconductor package. Thereafter, in the test apparatus, the unit is rearranged such that the first surface faces the test board. Then, a second external terminal of a second semiconductor package is brought into contact with the second tip portion of the probe pin and the first tip portion of the probe pin is brought into contact with the terminal of the test board, thereby performing the electrical test of the second semiconductor package.

BRIEF DESCRIPTIONS OF THE DRAWINGS

Figure 10:
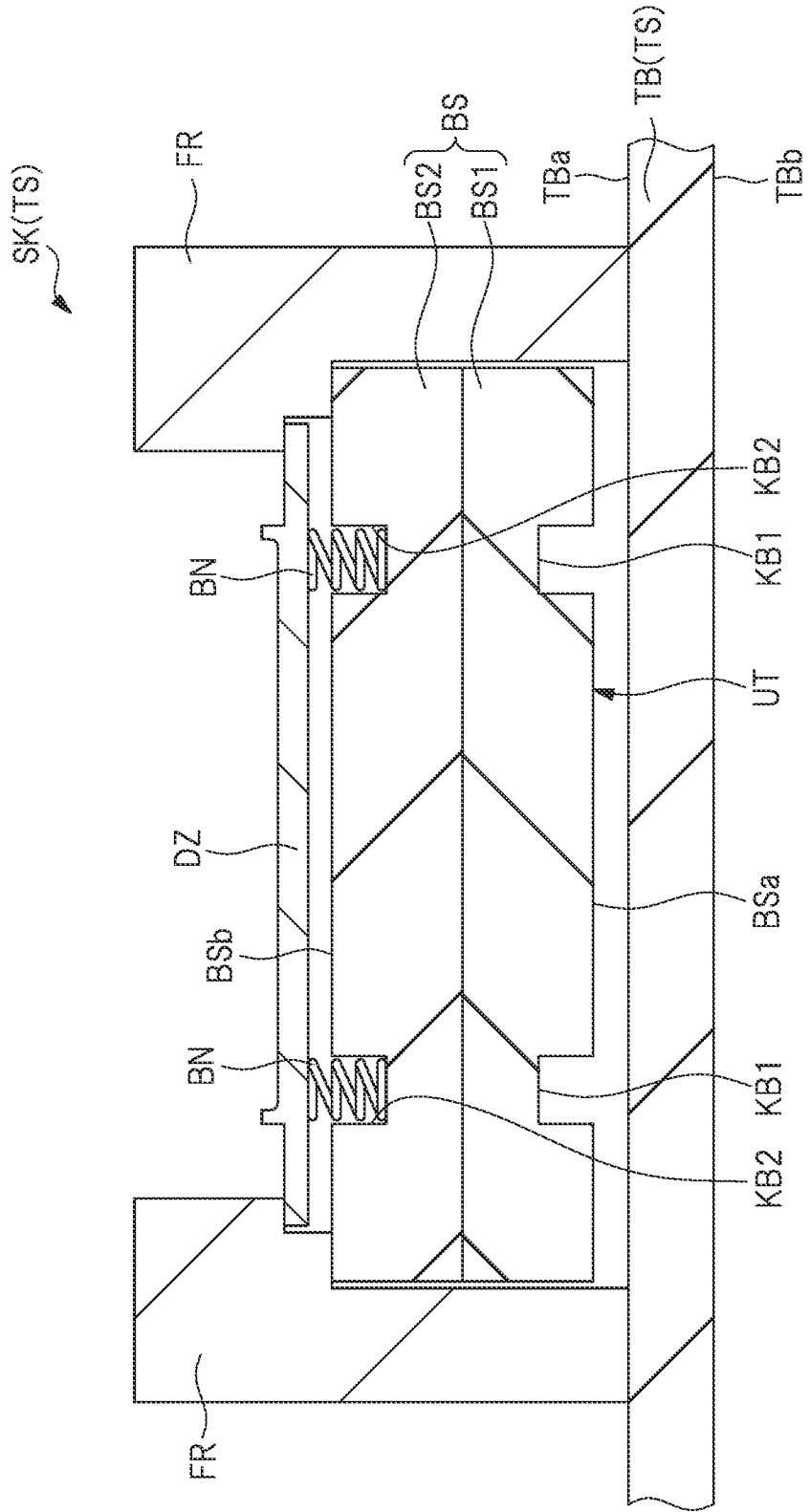

FIG. 10 a cross-sectional view showing a principal part of the test apparatus according to the embodiment in an enlarged manner.

Figure 11:
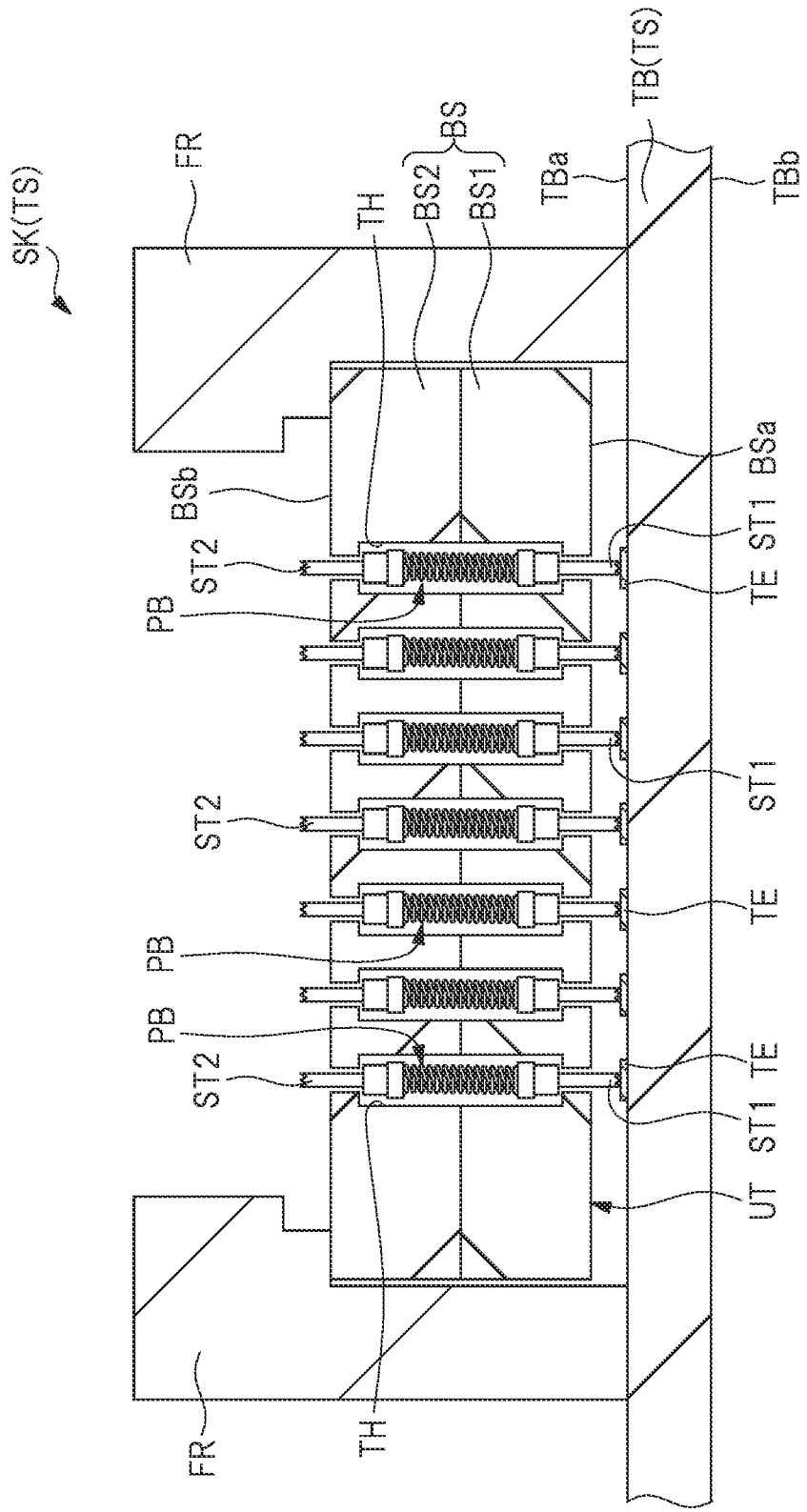

FIG. 11 a cross-sectional view showing a principal part of the test apparatus according to the embodiment in an enlarged manner.

Figure 12:
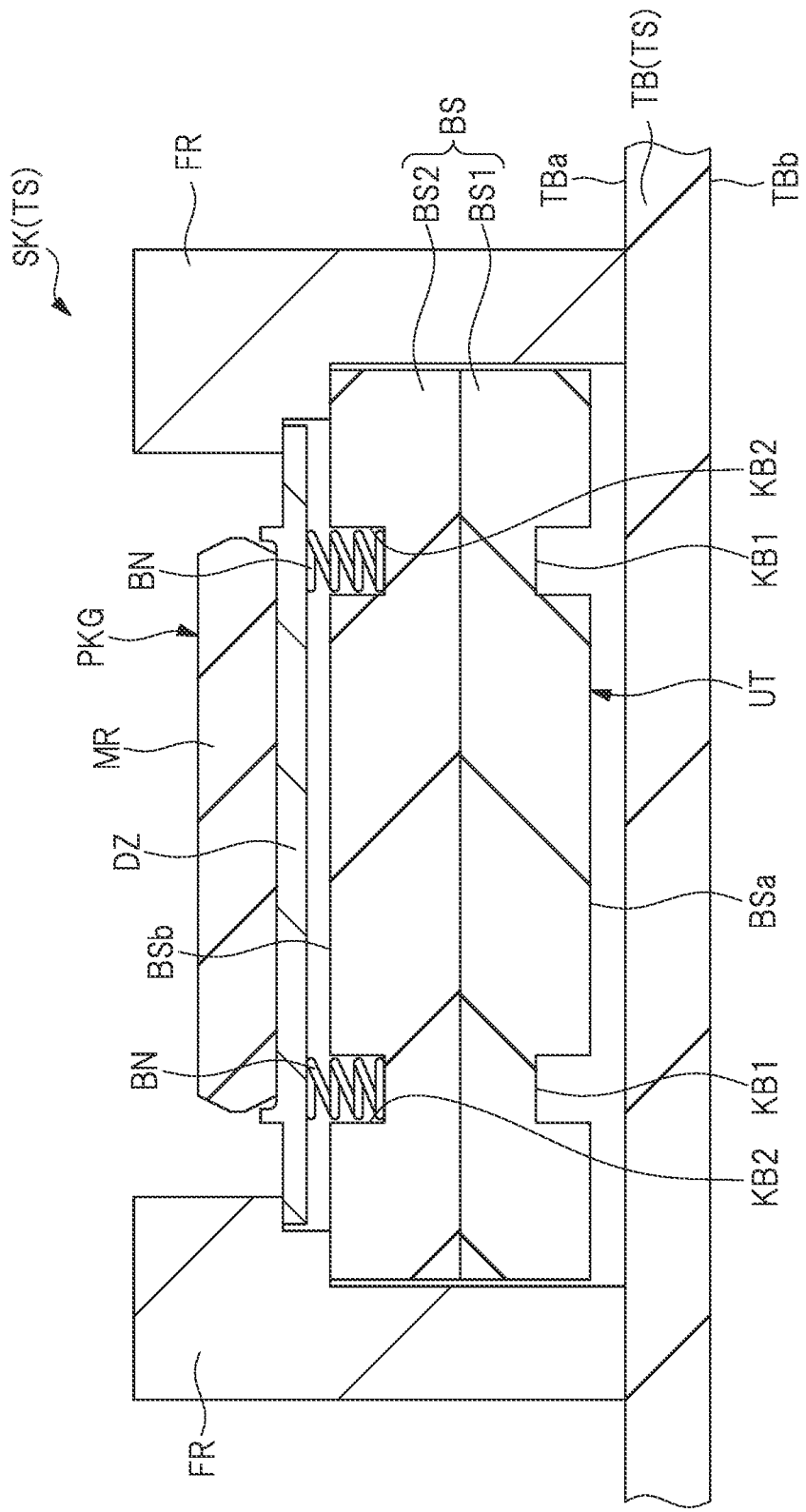

FIG. 12 a cross-sectional view showing a principal part of the test apparatus according to the embodiment in an enlarged manner.

Figure 13:
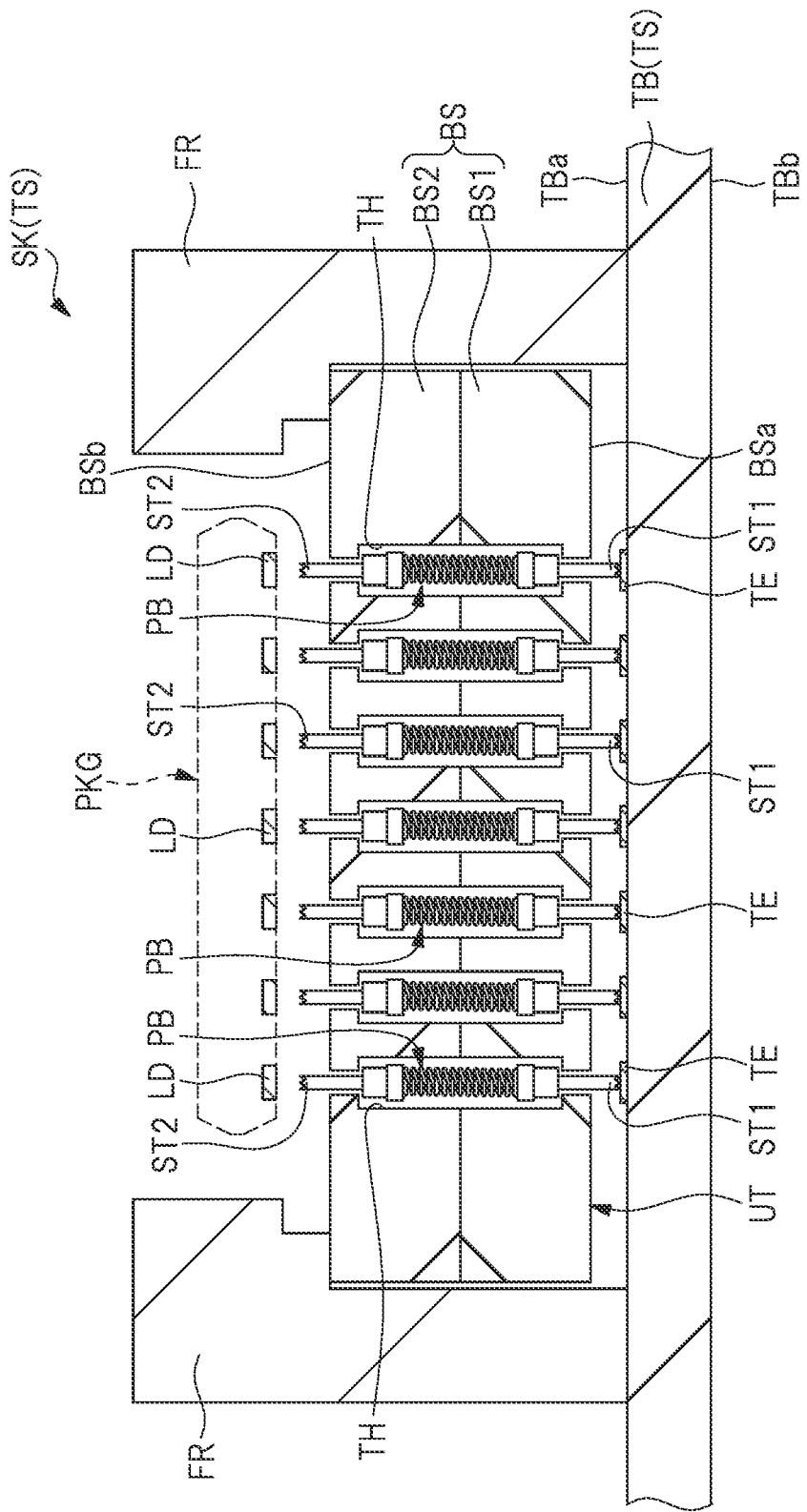

FIG. 13 a cross-sectional view showing a principal part of the test apparatus according to the embodiment in an enlarged manner.

Figure 14:
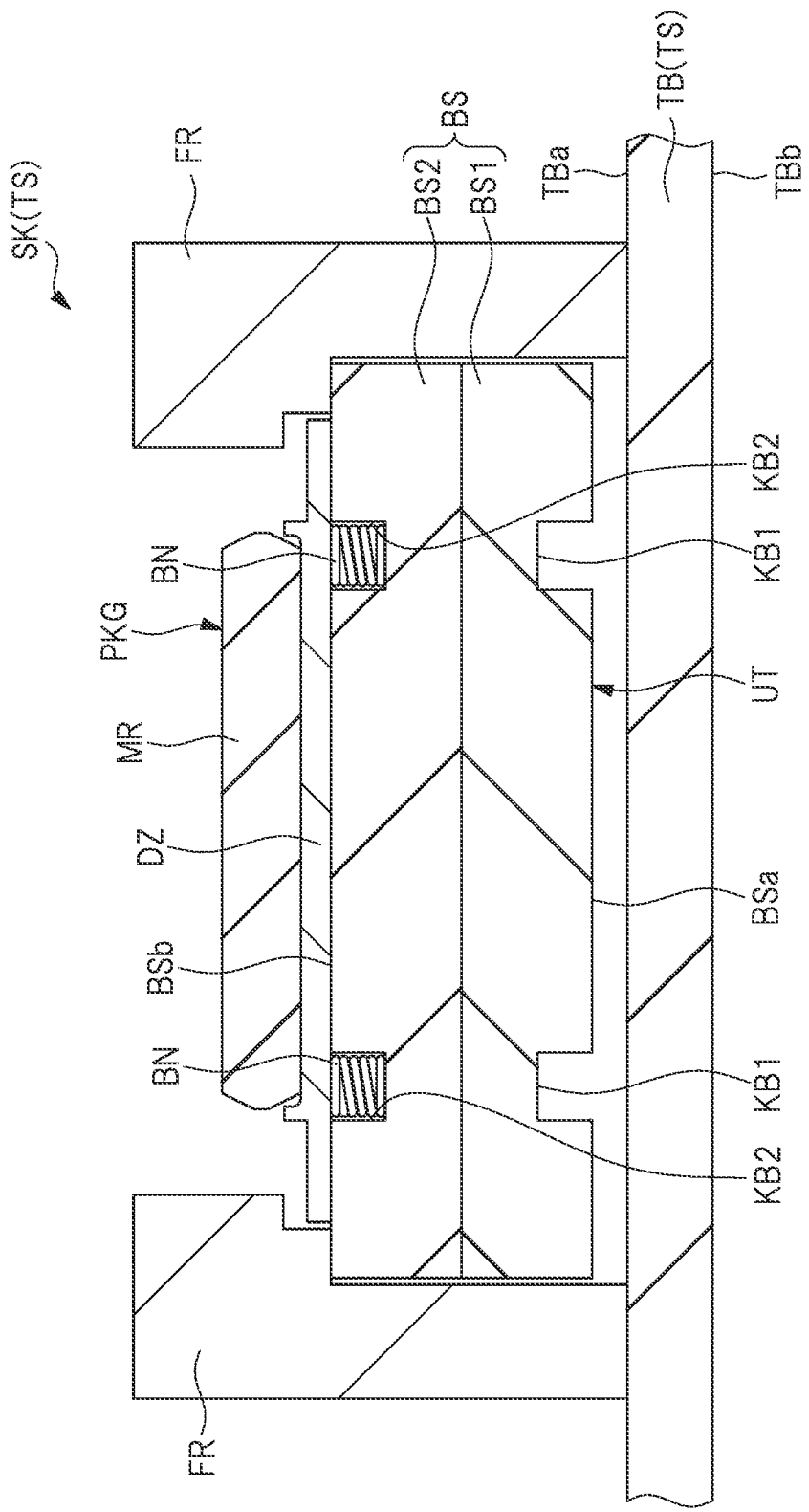

FIG. 14 a cross-sectional view showing a principal part of the test apparatus according to the embodiment in an enlarged manner.

Figure 15:
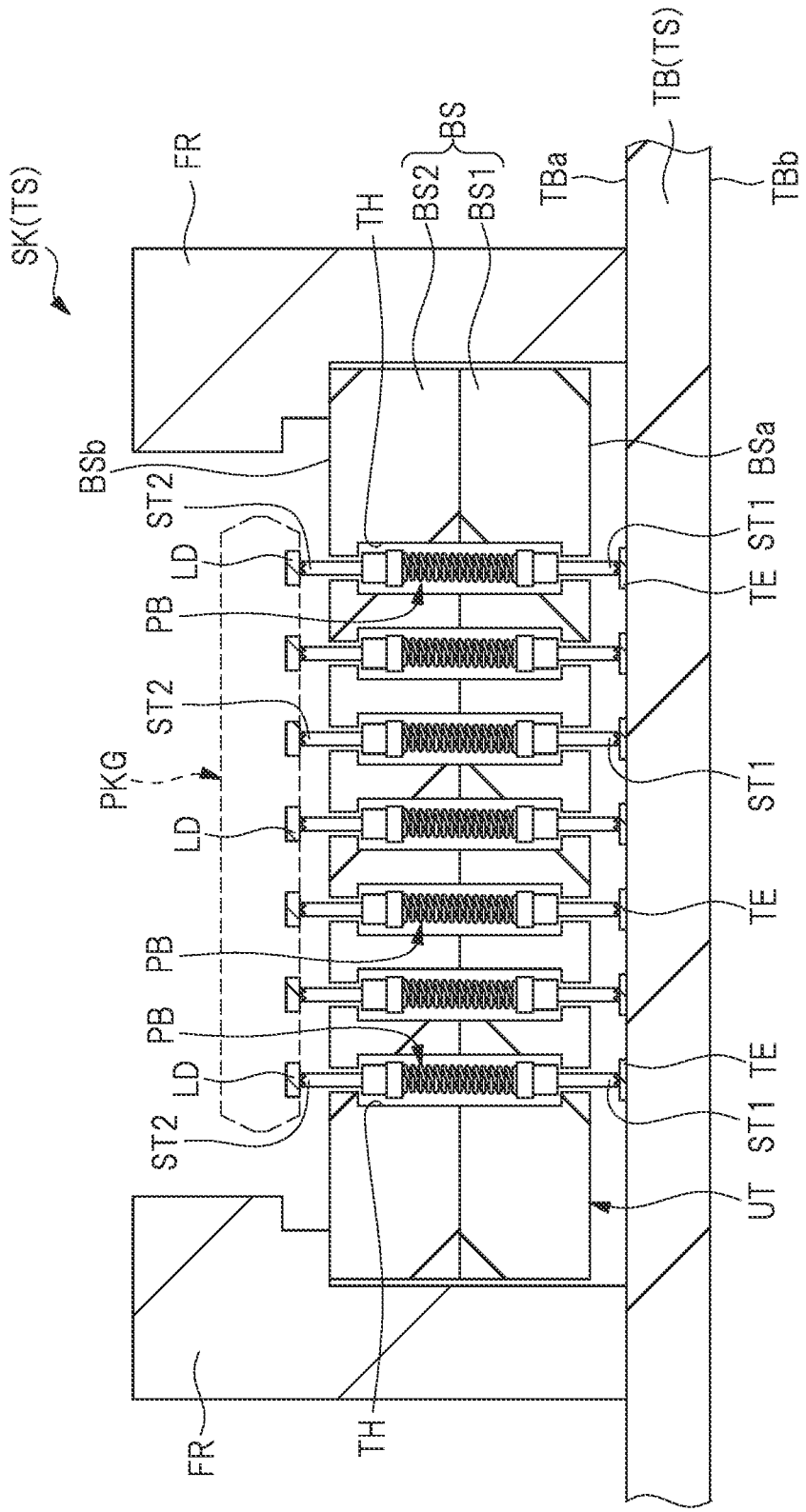

FIG. 15 a cross-sectional view showing a principal part of the test apparatus according to the embodiment in an enlarged manner.

Figure 16:
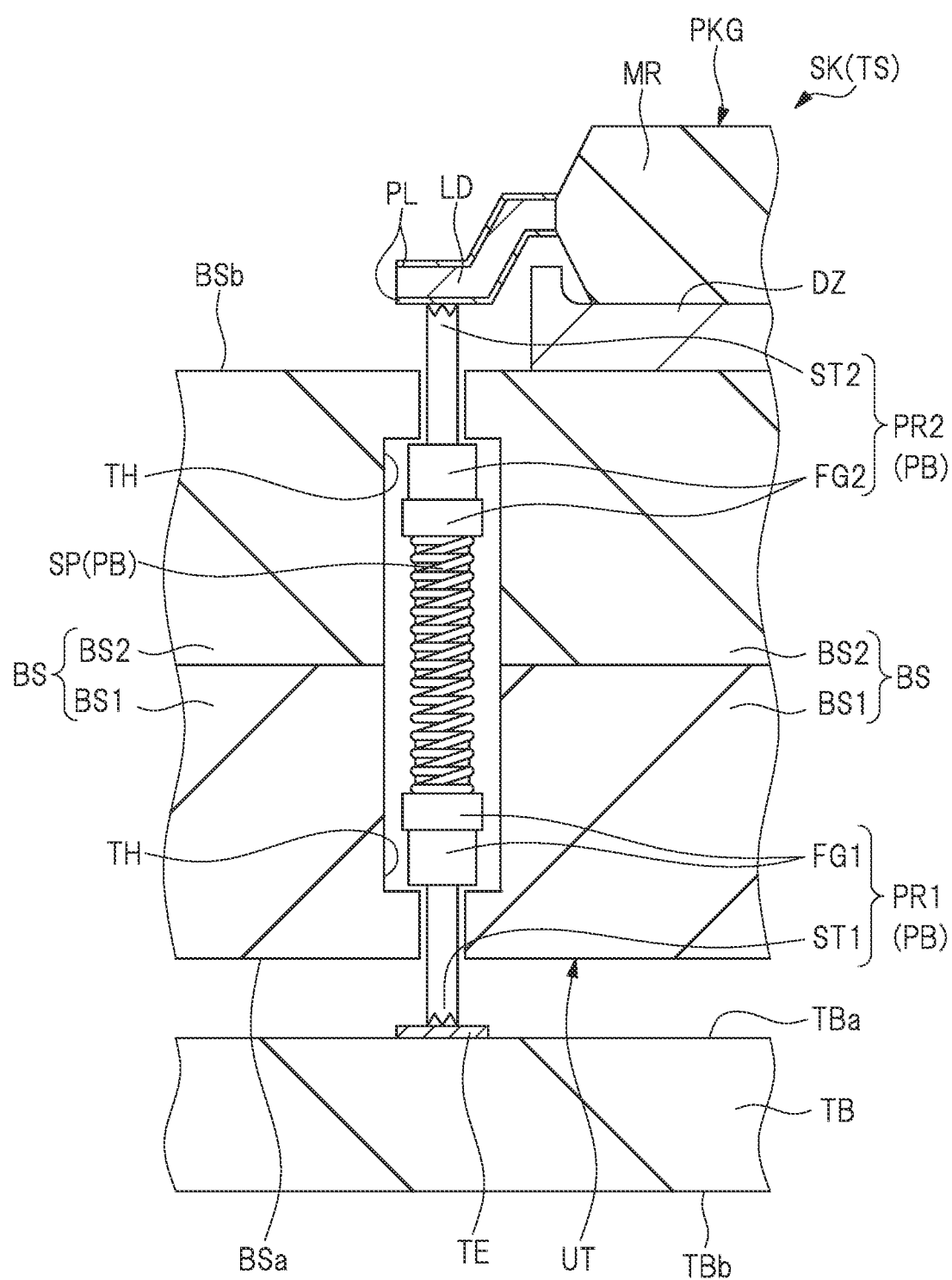

FIG. 16 a cross-sectional view showing a principal part of the test apparatus according to the embodiment in an enlarged manner.

Figure 17:
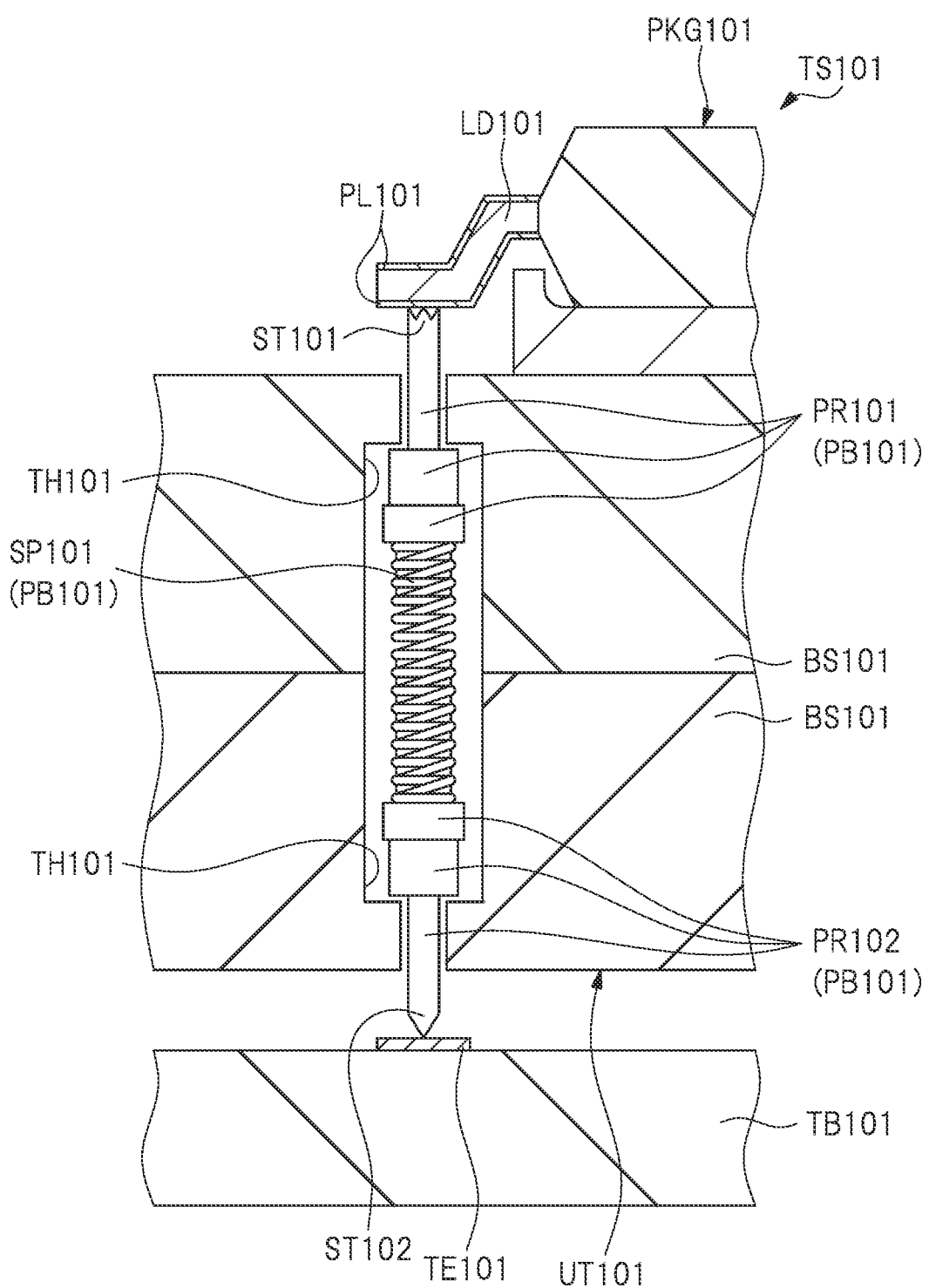

FIG. 17 is a cross-sectional view showing a principal part of a test apparatus according to a studied example in an enlarged manner.

Figure 18:
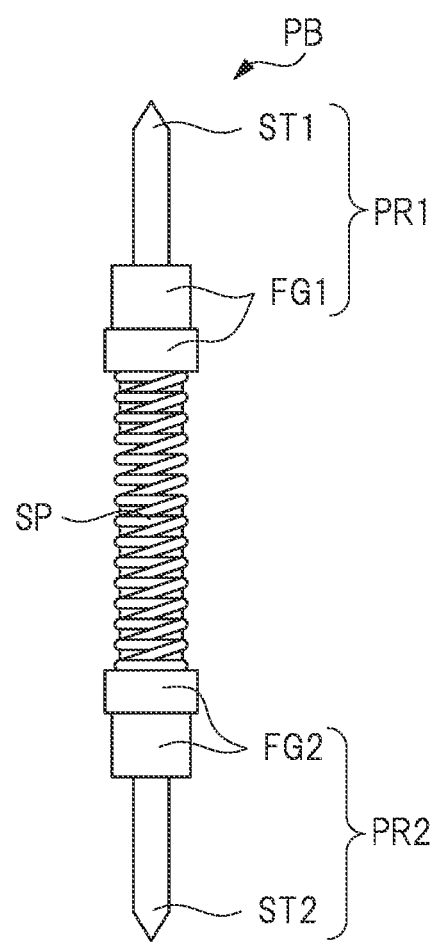

FIG. 18 is a side view of a probe pin according to a modification.

DETAILED DESCRIPTION

In this specification, the invention will be described in a plurality of sections or embodiments when required as a matter of convenience. However, these sections or embodiments are not irrelevant to each other unless otherwise stated, and one relates to a part or all of the other as details, a modification, or supplement. Also, in the embodiment described below, when mentioning the number of elements (including number of pieces, values, amount, range, and the like), the number of the elements is not limited to a specific number unless otherwise stated or except the case where the number is apparently limited to a specific number in principle, and the number larger or smaller than the specific number is also applicable. Furthermore, in the embodiment described below, it goes without saying that each component (including an element step) is not indispensable unless otherwise clearly specified or unless it is obvious that the component is indispensable in principle. Likewise, in the embodiment described below, when mentioning a shape, a positional relation, or the like of a component, a substantially approximate shape, a similar shape, or the like is included unless otherwise clearly specified or unless it is obvious from the context that the shape, the positional relation, or the like of the component differs in principle. The same applies to the above-described numerical value and range.

Hereinafter, an embodiment will be described in detail with reference to the drawings. Note that the same members are denoted by the same reference characters in principle throughout the drawings for describing the embodiment and the repetitive description thereof will be omitted. Also, in the following embodiment, descriptions of the same or similar parts are not repeated in principle unless particularly required.

In addition, in the drawings used for the embodiment, hatching may be omitted even in cross-sectional views so as to make them easy to see. Also, hatching may be applied even in plan views so as to make them easy to see.

Embodiment

<Semiconductor Device>

Figure 1:
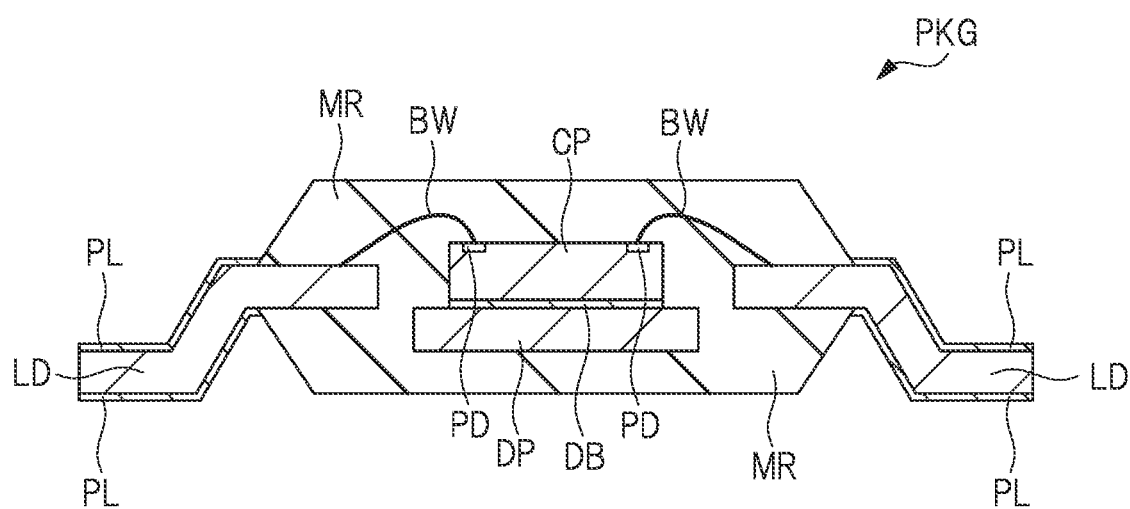
FIG. 1 is a cross-sectional view showing a semiconductor device according to an embodiment.

First, an example of a semiconductor device according to the present embodiment will be described with reference to FIG. 1. FIG. 1 is a cross-sectional view (side cross-sectional view) of the semiconductor device according to the present embodiment.

A semiconductor device PKG of the present embodiment is a semiconductor device in a package form, that is, a semiconductor package. Specifically, as shown in FIG. 1, the semiconductor device PKG includes a semiconductor chip CP, a die pad (chip mounting portion) DP on which the semiconductor chip CP is mounted, a plurality of leads (lead portions) LD formed of conductors, and a sealing portion (sealing resin portion) MR for sealing them.

The sealing portion MR is made of a resin material such as a thermosetting resin material, and may contain a filler or the like. For example, the sealing portion MR can be formed by using an epoxy resin containing a filler or the like.

The plurality of leads LD is composed of conductors, and is preferably made of a metal material such as copper (Cu) or a copper alloy. A part of each of the plurality of leads LD is sealed inside the sealing portion MR, and the other part thereof protrudes from side surfaces of the sealing portion MR to the outside of the sealing portion MR. Hereinafter, the portion of the lead LD located inside the sealing portion MR is referred to as an inner lead portion, and the portion of the lead LD located outside the sealing portion MR is referred to as an outer lead portion.

Note that the semiconductor device PKG of the present embodiment has a structure in which a part (outer lead portion) of each lead LD protrudes from the side surfaces of the sealing portion MR and the following description will be given based on this structure. However, the present invention is not limited to this structure, and the structure in which each lead LD hardly protrudes from the side surfaces of the sealing portion MR and a part of each lead LD is exposed on a lower surface of the sealing portion MR (QFN structure) or the like can also be adopted.

Each outer lead portion of the plurality of leads LD protrudes from the side surfaces of the sealing portion MR to the outside of the sealing portion MR. The outer lead portion of each lead LD is bent such that a lower surface of the outer lead portion near the end portion is located on substantially the same plane as the lower surface of the sealing portion MR. The outer lead portion of the lead LD functions as an external connection terminal (external terminal) of the semiconductor device PKG. A plating layer PL is formed on the surface of the outer lead portion of the lead LD. The plating layer PL is made of solder (solder material), for example, Sn-based solder, Sn—Bi-based solder, or Sn—Ag—Cu-based solder. Therefore, the surface of the outer lead portion of the lead LD is covered with a solder material (here, the plating layer PL). The plating layer PL can also be regarded as a part of the outer lead portion of the lead LD. The combination of the outer lead portion of each lead LD and the plating layer PL formed on the surface thereof can be regarded as an external terminal of the semiconductor device PKG. In that case, the surface of the external terminal of the semiconductor device PKG is composed of a solder material (here, a solder material constituting the plating layer PL).

The die pad DP is composed of a conductor, and is preferably made of a metal material such as copper (Cu) or a copper alloy. On an upper surface of the die pad DP, the semiconductor chip CP is mounted with its front surface facing upward and its back surface facing the die pad DP. The back surface of the semiconductor chip CP is bonded and fixed to the die pad DP via an adhesive layer (bonding material) DB. The semiconductor chip CP is sealed inside the sealing portion MR and is not exposed from the sealing portion MR.

The semiconductor chip CP is manufactured by forming various semiconductor elements or semiconductor integrated circuits on a main surface of a semiconductor substrate made of, for example, single crystal silicon, and then separating the semiconductor substrate into each semiconductor chip by dicing or the like.

The semiconductor chip CP is electrically connected to the plurality of leads LD via a plurality of bonding wires BW. Specifically, a plurality of pad electrodes PD is formed on the surface of the semiconductor chip CP, and the plurality of pad electrodes PD is electrically connected to the plurality of leads LD via the plurality of bonding wires BW. Namely, one end of both ends of each bonding wire BW is connected to the pad electrode PD of the semiconductor chip CP, and the other end is connected to the inner lead portion of the lead LD. The bonding wire BW has conductivity, and is preferably made of a fine metal wire such as a gold (Au) wire, a copper (Cu) wire, or an aluminum (Al) wire. The bonding wire BW is sealed inside the sealing portion MR and is not exposed from the sealing portion MR.

<Manufacturing Process of Semiconductor Device>

A manufacturing process of a semiconductor device according to the present embodiment includes a step of preparing a test apparatus TS described later, a step of preparing the semiconductor device (object to be tested) PKG shown in FIG. 1 described above, and a step of performing an electrical test (test step) for the semiconductor device PKG after these steps.

The step of preparing the semiconductor device PKG includes a step of mounting the semiconductor chip CP on the die pad DP of the lead frame (die bonding step) and a step of electrically connecting the plurality of pad electrodes PD of the semiconductor chip CP and (the inner lead portions of) the plurality of leads LD of the lead frame via the plurality of bonding wires BW (wire bonding step). The step of preparing the semiconductor device PKG further includes a step of sealing the semiconductor chip CP, the die pad DP, the plurality of bonding wires BW, and (the inner lead portions of) the plurality of leads LD with the sealing portion MR (molding step), a step of forming the plating layer PL on the surface of the plurality of leads LD exposed from the sealing portion MR, a step of cutting the plurality of leads LD from the lead frame, and a step of bending the plurality of leads LD.

In the step of performing the electrical test for the semiconductor device PKG (test step), the electrical test is performed for the semiconductor device PKG by using the test apparatus TS described below. This step is referred to as an electrical test step or a test step.

<Test Apparatus>

Figure 2:
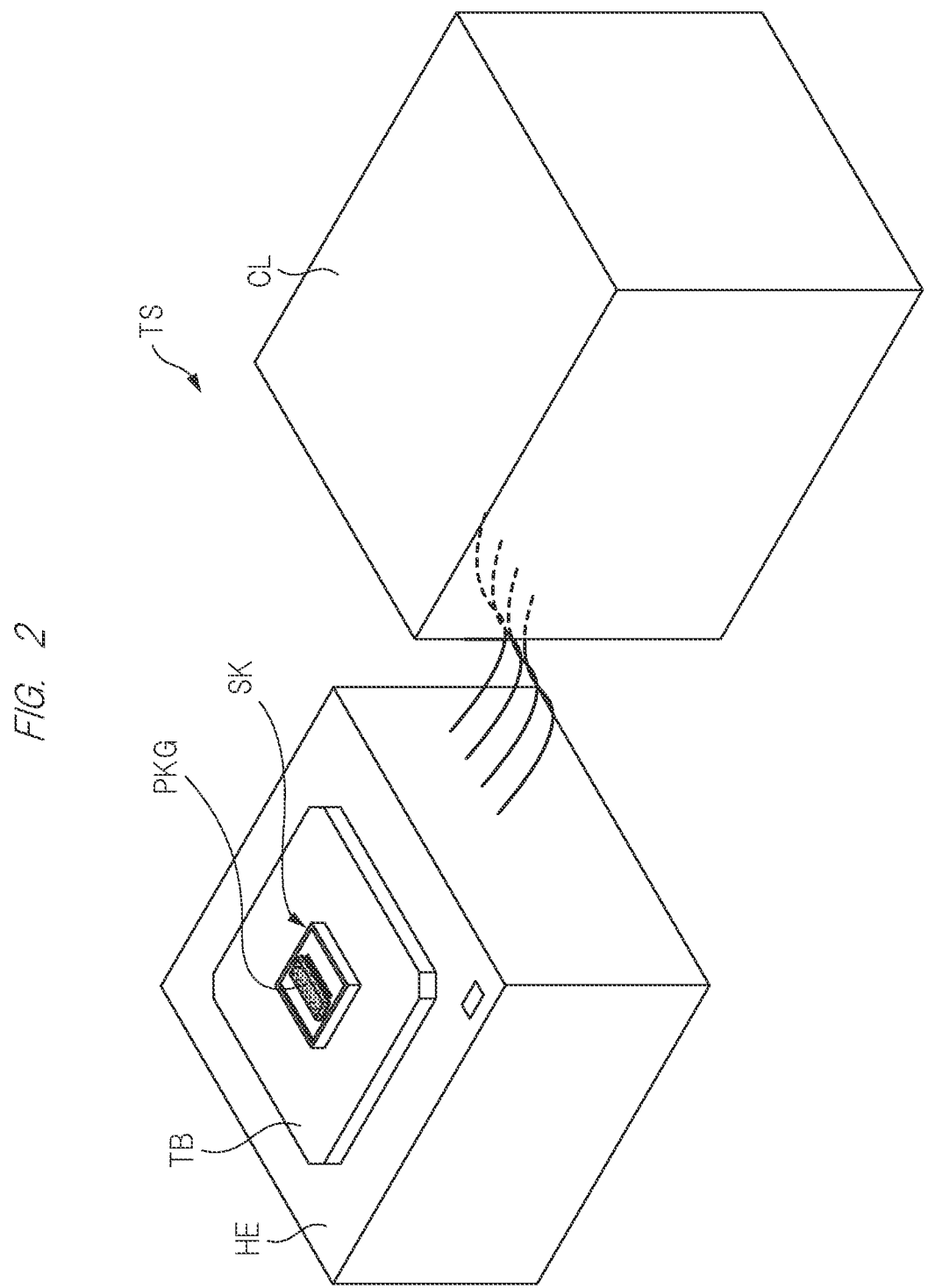
FIG. 2 is an explanatory diagram schematically showing a configuration of a test apparatus according to the embodiment.
Figure 3:
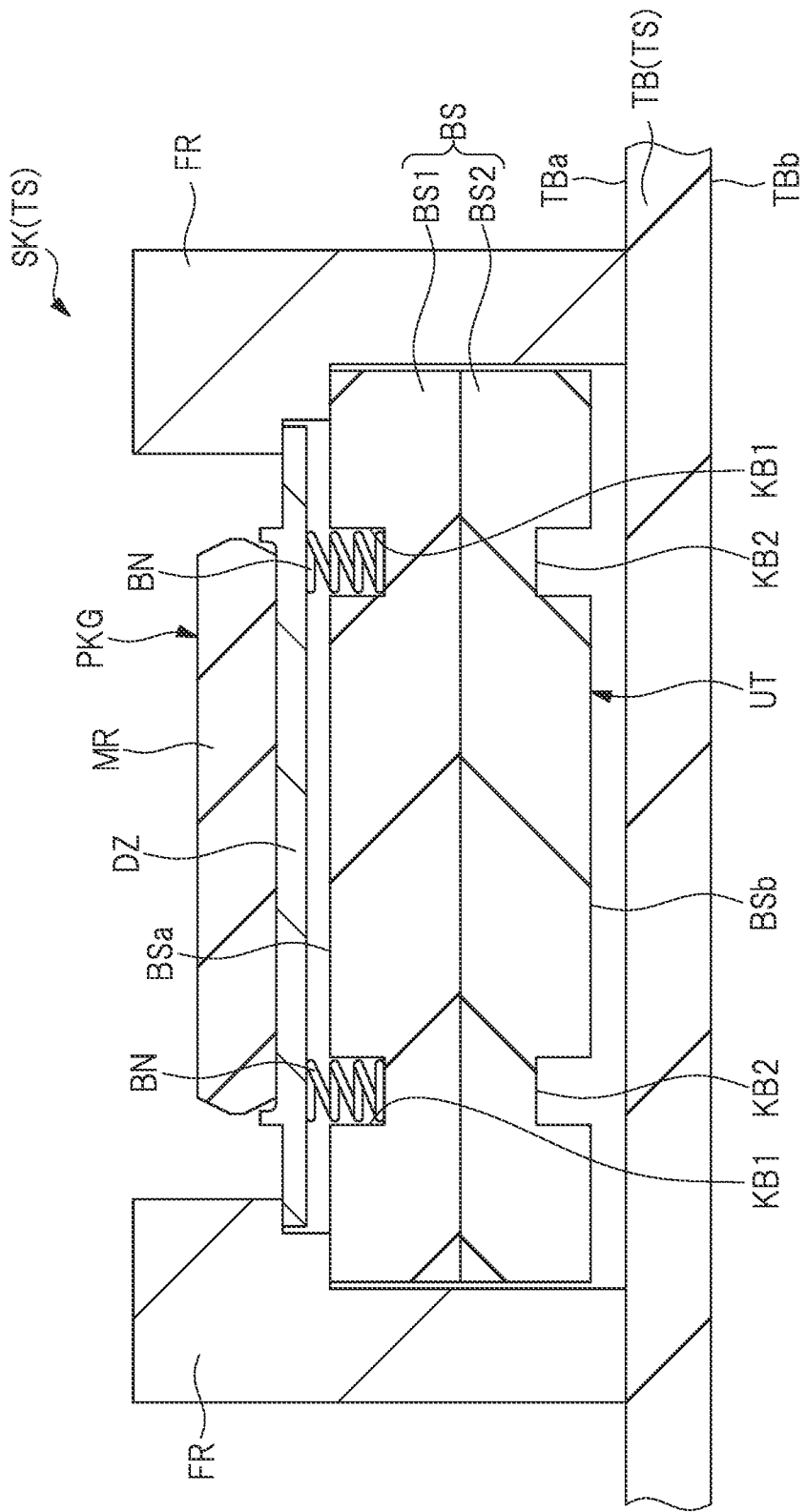
FIG. 3 is a cross-sectional view showing a principal part of the test apparatus according to the embodiment in an enlarged manner.
Figure 4:
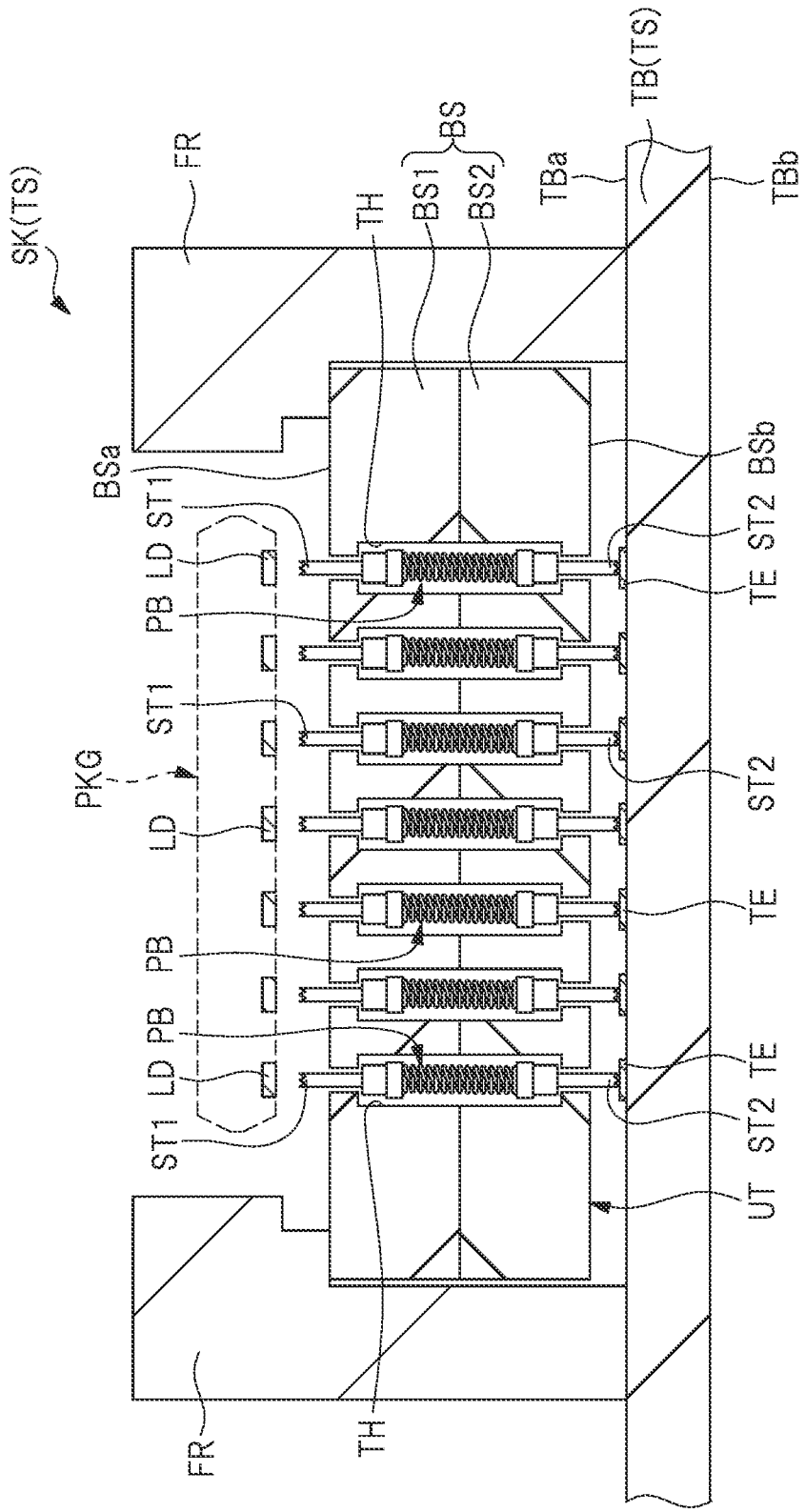
FIG. 4 is a cross-sectional view showing a principal part of the test apparatus according to the embodiment in an enlarged manner.
Figure 5:
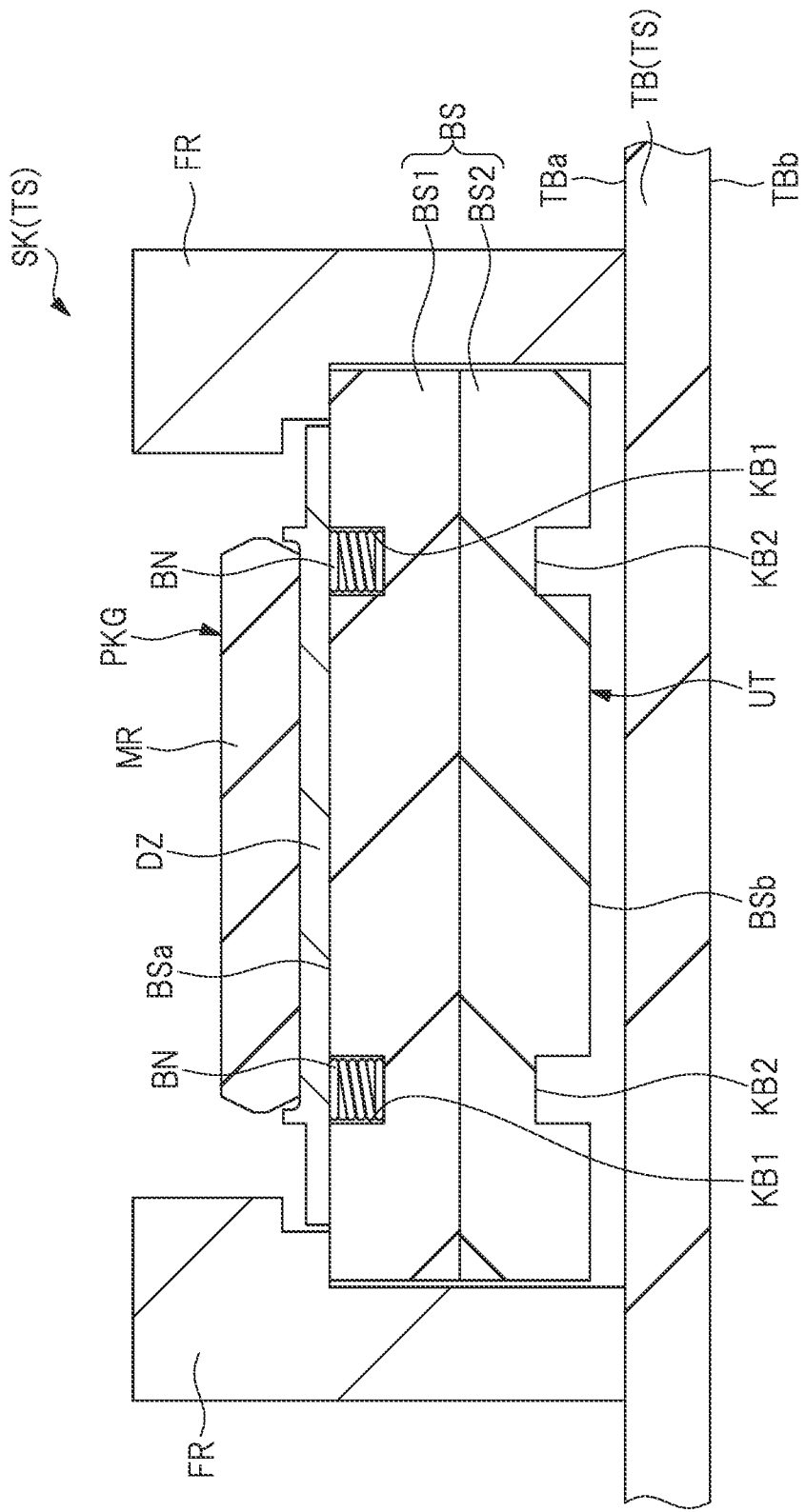
FIG. 5 is a cross-sectional view showing a principal part of the test apparatus according to the embodiment in an enlarged manner.
Figure 6:
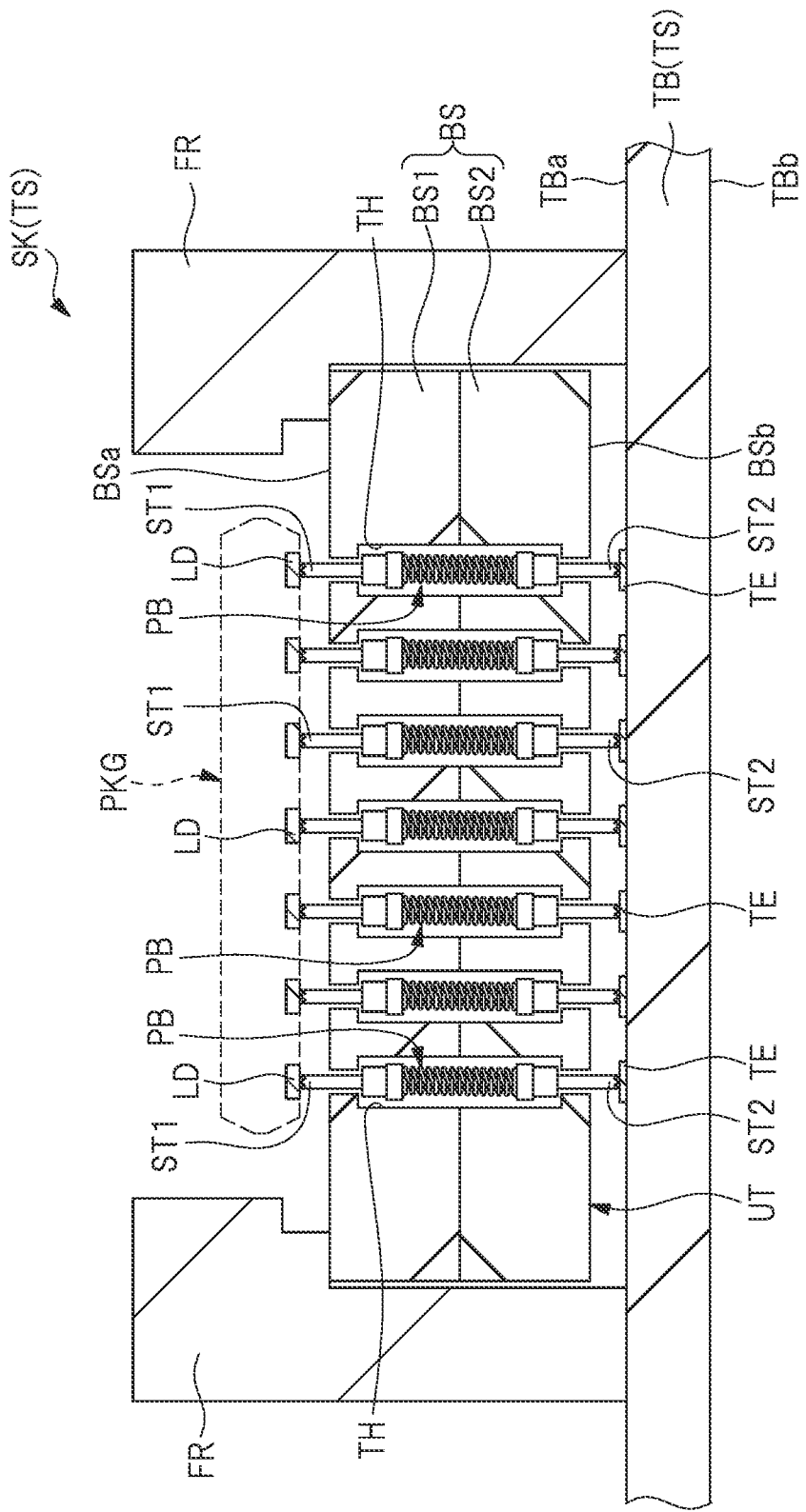
FIG. 6 is a cross-sectional view showing a principal part of the test apparatus according to the embodiment in an enlarged manner.
Figure 7:
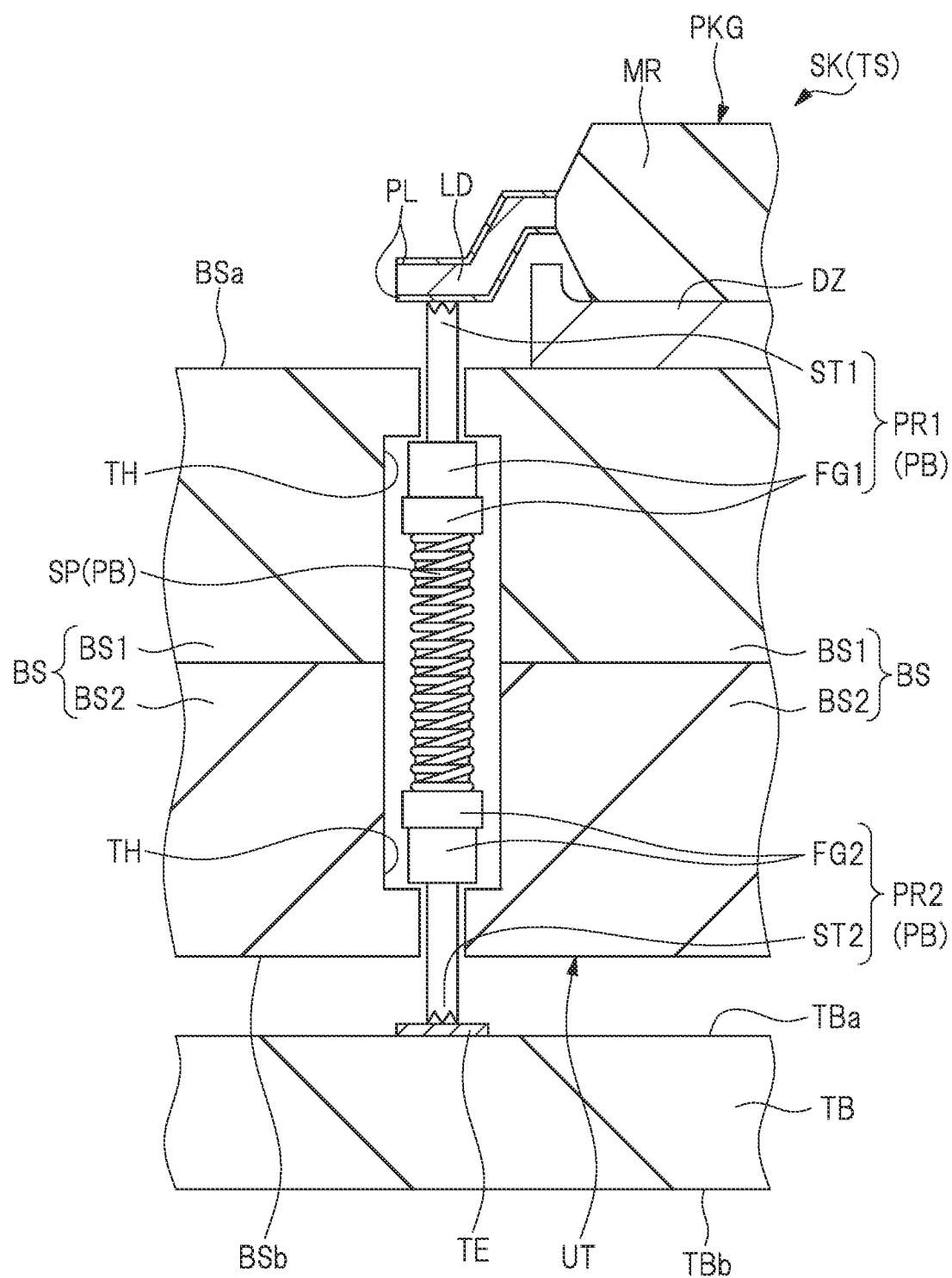
FIG. 7 is a cross-sectional view showing a principal part of the test apparatus according to the embodiment in an enlarged manner.
Figure 8:
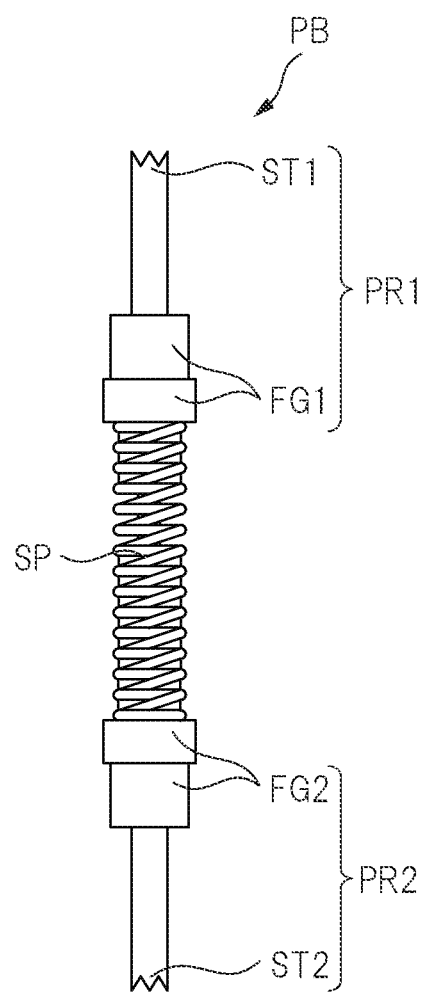
FIG. 8 is a side view of a probe pin used in the test apparatus according to the embodiment.
Figure 9:
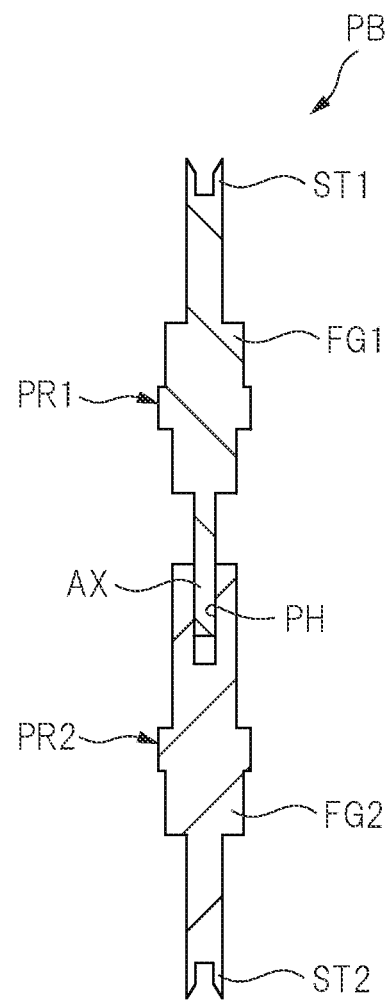
FIG. 9 is a cross-sectional view of the probe pin used in the test apparatus according to the embodiment.

FIG. 2 is an explanatory diagram schematically showing the configuration of the test apparatus (electrical test apparatus, inspection apparatus, tester) TS for performing the electrical test for the semiconductor device PKG. FIG. 3 to FIG. 6 are cross-sectional views showing the principal part of the test apparatus TS shown in FIG. 2 around a socket SK in an enlarged manner. FIG. 3 and FIG. 4 correspond to the state in which the semiconductor device PKG to be tested is arranged on a seat DZ of the socket SK of the test apparatus TS, and FIG. 5 and FIG. 6 correspond to the state in which the semiconductor device PKG is arranged as shown in FIG. 3 and FIG. 4 and then the semiconductor device PKG is pushed toward a probe unit UT of the test apparatus TS. Also, although FIG. 3 and FIG. 4 show cross-sections at different positions, FIG. 3 and FIG. 5 show cross-sections at the same position, and FIG. 4 and FIG. 6 show cross-sections at the same position. Namely, FIG. 3 and FIG. 5 show the cross-sections at the position which does not cross the probe pin PB, and FIG. 4 and FIG. 6 show the cross-sections at the position which crosses the probe pin PB. Further, FIG. 7 is a cross-sectional view showing the principal part around the socket SK of the test apparatus TS in an enlarged manner, and it shows the state in which the lead LD of the semiconductor device PKG and the terminal TE of the test board TB are electrically connected via the probe pin PB. Note that FIG. 7 corresponds to the state in which the semiconductor device PKG is pushed toward the probe unit UT of the test apparatus TS as in FIG. 5 and FIG. 6. FIG. 8 is a side view of the probe pin PB and FIG. 9 is a cross-sectional view of the probe pin PB. In FIG. 9, the illustration of a spring SP is omitted for the sake of simplicity.

As shown in FIG. 2, the test apparatus TS of the present embodiment includes the socket (housing unit) SK which houses the semiconductor device PKG to be tested, the test board (wiring board, performance board) TB electrically connected to the semiconductor device PKG via the socket SK, and a test head HE electrically connected to the test board TB. A test circuit configured to input and output a signal or a test voltage from/to the semiconductor device PKG is formed in the test head HE, and the test circuit is electrically connected to the semiconductor device PKG via the test board TB and the socket SK.

Also, a control unit (tester main body) CL is arranged next to the test head HE, and the control unit CL is electrically connected to the test head HE. A control circuit for controlling the electrical test is formed in the control unit CL, and the control unit CL performs, for example, the control of the relative position between the test head HE and the semiconductor device PKG or the control of the continuous testing of the plurality of semiconductor devices PKG. As another aspect, a control circuit may be formed inside the test head HE.

The test board TB is a wiring board having an upper surface TBa on which the socket SK is mounted and a lower surface (back surface) TBb located on opposite side of the upper surface TBa. The test board TB is arranged and fixed on the upper surface of the test head HE such that the lower surface TBb of the test board TB faces the upper surface of the test head HE. The method of fixing the test board TB is not particularly limited.

As shown in FIG. 3 to FIG. 7, a conductor pattern (conductor layer) including a plurality of terminals (electrodes) TE is formed on the upper surface TBa of the test board TB. The plurality of terminals TE formed on the upper surface TBa of the test board TB is electrically connected to the test circuit formed in the test head HE via a wiring formed on the upper surface TBa of the test board TB (not shown), a via wiring penetrating the test board TB (not shown), and a wiring formed on the lower surface TBb of the TB (not shown).

The terminal TE is a terminal for contacting the probe pin PB. The terminal TE preferably contains a gold (Au) film. When the terminal TE has a single-layer structure, the terminal TE is preferably made of gold (Au). Also, when the terminal TE has a laminated structure, the uppermost layer thereof is preferably made of gold (Au).

The socket SK is mounted on the upper surface TBa of the test board TB. The socket SK has an outer frame portion (socket main body) FR and the probe unit UT. The probe unit UT is housed (arranged) in an opening of the outer frame portion FR. Therefore, the probe unit UT is surrounded by the outer frame portion FR in a plan view. Here, the plan view corresponds to the case of seeing the plane substantially parallel to the upper surface Tba of the test board TB.

The outer frame portion FR of the socket SK is arranged on the upper surface TBa of the test board TB and is fixed to the test board TB. The method of fixing the outer frame portion FR is not particularly limited, but the outer frame portion FR can be fixed to the test board TB by, for example, a screw (not shown). The outer frame portion FR is mainly made of an insulating material such as a resin.

The probe unit UT has a base portion BS and a plurality of probe pins (test terminals, pogo pins, contact terminals, contactors) PB housed in the base portion BS. The plurality of probe pins PB is inserted (housed) in a plurality of through holes (probe holes) TH provided in the base portion BS, respectively. The probe pin PB is provided in order to electrically connect the lead LD of the semiconductor device PKG and the terminal TE of the test board TB via the probe pin PB.

The probe unit UT preferably has as many probe pins PB as the external terminals (leads LD in this case) of the semiconductor device PKG to be tested. The number of external terminals of the semiconductor device PKG is, for example, 64 to 144, but is not limited to this.

The base portion BS has, for example, a plate shape, and is preferably made of an insulating material such as a resin. The base portion BS has a main surface BSa and a main surface BSb that are located on opposite side to each other, and the main surface BSb of the base portion BS faces the upper surface TBa of the test board TB in the case of FIG. 3 to FIG. 7. In this case, the main surface BSb of the base portion BS corresponds to the lower surface of the base portion BS, and the main surface BSa of the base portion BS corresponds to the upper surface of the base portion BS. In the case of FIG. 3 to FIG. 6, the outer peripheral portion of the main surface BSa of the base portion BS is pressed by the outer frame portion FR, so that the probe unit UT is held by the test board TB.

The base portion BS may also be composed of a plurality of members. For example, in the case of FIG. 3 to FIG. 7, the base portion BS has two plate-shaped members BS1 and BS2 that are laminated on each other. Specifically, the base portion BS has a structure in which the plate-shaped member BS1 and the plate-shaped member BS2 are laminated on each other. In the case of FIG. 3 to FIG. 7, of the plate-shaped members BS1 and BS2 constituting the base portion BS, the member BS1 is arranged on the upper side and the member BS2 is arranged on the lower side (the side closer to the test board TB). The through hole TH in which the probe pin PB is housed penetrates the laminated members BS1 and BS2. Also, the thickness of the member BS1 and the thickness of the member BS2 may be different from each other. However, when the thickness of the member BS1 and the thickness of the member BS2 are made equal to each other, the cost required for preparing the probe unit UT can be suppressed because the same member can be commonly used for the member BS1 and the member BS2.

The seat DZ is arranged on the probe unit UT, that is, on the base portion BS via an elastic body BN such as a spring. In the case of FIG. 3 to FIG. 7, the seat DZ is arranged on the main surface BSa of the base portion BS via the elastic body BN. The elastic body BN such as a spring is housed in a concave portion (recessed portion) KB1 provided in the main surface BSa of the base portion BS, and a part of the elastic body BN protrudes from the main surface BSa of the base portion BS and is in contact with the lower surface of the seat DZ. The elastic body BN exerts a force for lifting the seat DZ on the seat DZ.

The semiconductor device PKG is housed in the opening of the outer frame portion FR, and is mounted (arranged) on the seat DZ on the probe unit UT. Therefore, in a plan view, the semiconductor device PKG is surrounded by the outer frame portion FR and overlaps with the probe unit UT. The probe unit UT is present below the semiconductor device PKG.

Further, a pressing jig (not shown) can be arranged above the socket SK (thus, above the semiconductor device PKG). By pressing the upper surface of the sealing portion MR of the semiconductor device PKG, the pressing jig can push the semiconductor device PKG toward the probe unit UT. Alternatively, by applying a pressing force to (the outer lead portions of) the plurality of leads LD of the semiconductor device PKG, the pressing jig can push the semiconductor device PKG toward the probe unit UT.

FIG. 3 and FIG. 4 show the stage after the semiconductor device PKG to be tested is arranged on the seat DZ and before the semiconductor device PKG is pushed toward the probe unit UT. Meanwhile, FIG. 5 to FIG. 7 show the stage in which the semiconductor device PKG has been pushed toward the probe unit UT by the pressing jig after arranging the semiconductor device PKG on the seat DZ as shown in FIG. 3 and FIG. 4.

At the stage of FIG. 3 and FIG. 4, since the elastic body BN is lifting the seat DZ, the seat DZ is separated from the base portion BS, and each lead LD of the semiconductor device PKG is separated from the probe pin PB. Therefore, at the stage of FIG. 3 and FIG. 4, each lead LD of the semiconductor device PKG is not in contact with the probe pin PB, and the lead LD and the probe pin PB located below the lead LD are not electrically connected to each other.

On the other hand, at the stage of FIG. 5 to FIG. 7, the semiconductor device PKG is pushed toward the probe unit UT with the pressing jig, whereby the semiconductor device PKG descends together with the seat DZ and approaches the base portion BS, so that (the outer lead portion of) each lead LD of the semiconductor device PKG comes into contact with the probe pin PB located below the lead LD. Therefore, at the stage of FIG. 5 to FIG. 7, (the outer lead portion of) each lead LD of the semiconductor device PKG is in contact with the probe pin PB located below the lead LD, so that the lead LD and the probe pin PB located below the lead LD are electrically connected to each other.

Also, at the stage of FIG. 5 to FIG. 7, each probe pin PB of the probe unit UT comes into contact with and is electrically connected to the terminal TE of the test board TB located below the probe pin PB. Note that it is not essential that the probe pin PB and the terminal TE are in contact (electrically connected) at the stage of FIG. 3 and FIG. 4, but the probe pin PB and the terminal TE are in contact with and electrically connected to each other in the case of FIG. 5.

The configuration of the probe pin PB will be further described with reference to FIG. 7 to FIG. 9.

As shown in FIG. 7 to FIG. 9, the probe pin PB includes a plunger (plunger portion) PR1, a plunger (plunger portion) PR2 arranged on opposite side of the plunger PR1, and a spring (spring portion) SP as an elastic body to be arranged between the plunger PR1 and the plunger PR2, and has an elongated rod-like (needle-like) shape as a whole. In the probe pin PB, the plunger PR1 and the plunger PR2 are arranged so as to face each other via an elastic body portion (here, the spring SP). In the case of FIG. 7 and FIG. 8, the spring SP is a coil spring. The plunger PR1 has a tip portion ST1 opposite the side facing the plunger PR2, and the plunger PR2 has a tip portion ST2 opposite the side facing the plunger PR1. The tip portion ST1 corresponds to one tip portion of the probe pin PB, the tip portion ST2 corresponds to the other tip portion of the probe pin PB, and the tip portion ST2 is the tip portion located on opposite side of the tip portion ST1 in the probe pin PB. The plungers PR1 and PR2 have conductivity and are each made of a metal material. It is preferable that the plungers PR1 and PR2 (in particular, the tip portions ST1 and ST2) are made of the same material (same metal material).

Each probe pin PB (plungers PR1 and PR2 and spring SP) is housed (inserted) in the through hole TH of the base portion BS of the probe unit UT. Note that the tip portion ST1 of the plunger PR1 constituting the probe pin PB (that is, the tip portion ST1 of the probe pin PB) protrudes from the main surface BSa of the base portion BS of the probe unit UT. Further, the tip portion ST2 of the plunger PR2 constituting the probe pin PB (that is, the tip portion ST2 of the probe pin PB) protrudes from the main surface BSb of the base portion BS of the probe unit UT. It is preferable that the amount of protrusion of the probe pin PB from the main surface BSa of the base portion BS and the amount of protrusion of the probe pin PB from the main surface BSb of the base portion BS are the same.

In the present embodiment, the tip portion ST1 and the tip portion ST2 have the same shape in each probe pin PB. From another point of view, the tip portion ST1 and the tip portion ST2 have a symmetrical structure in each probe pin PB. In the case of FIG. 7 to FIG. 9, both the tip portion ST1 and the tip portion ST2 have a crown-like shape.

The plunger PR1 has a flange portion FG1 and the plunger PR2 has a flange portion FG2. In the plunger PR1, the flange portion FG1 is provided on the inner side (side closer to the plunger PR2) than the tip portion ST1, and in the plunger PR2, the flange portion FG2 is provided on the inner side (side closer to the plunger PR1) than the tip portion ST2. In the plunger PR1, the flange portion FG1 annularly overhangs outward (that is, overhangs in a direction in which the diameter increases). Further, in the plunger PR2, the flange portion FG2 annularly overhangs outward (that is, overhangs in a direction in which the diameter increases).

Namely, the plunger PR1 has a substantially cylindrical outer shape, but the diameter of the flange portion FG1 is larger than the diameter of the part of the plunger PR1 on the tip side from the flange portion FG1. Also, the plunger PR2 has a substantially cylindrical outer shape, but the diameter of the flange portion FG2 is larger than the diameter of the part of the plunger PR2 on the tip side from the flange portion FG2. The spring SP is arranged between the flange portion FG1 of the plunger PR1 and the flange portion FG2 of the plunger PR2.

A hole PH is provided at the root of the plunger PR2 (the end portion opposite the tip portion ST2), and a thin rod-shaped shaft portion AX provided at the root of the plunger PR1 (the end portion opposite the tip portion ST1) is inserted in the hole PH. Namely, the root portion of the plunger PR2 encloses a part of the plunger PR1 (shaft portion AX). Consequently, the plunger PR1 and the plunger PR2 are in contact with each other, so that the plunger PR1 and the plunger PR2 are electrically connected to each other. Also, when the spring SP has conductivity, the plunger PR1 and the plunger PR2 can be electrically connected to each other by contacting the spring SP with both the plunger PR1 and the plunger PR2. Therefore, in each probe pin PB, the tip portion ST1 and the tip portion ST2 are electrically connected to each other through a conductor.

<Test Step>

The test step in which the electrical test is performed for the semiconductor device PKG by using the test apparatus TS will be described.

First, the test apparatus TS is prepared. The preparation of the test apparatus TS may be performed before or after the preparation of the semiconductor device PKG to be tested, or may be performed at the same time as the preparation of the semiconductor device PKG to be tested. In the test apparatus TS prepared here, as shown in FIG. 3 and FIG. 4, the probe unit UT is arranged on the test board TB such that the main surface BSb of the base portion BS of the probe unit UT faces the upper surface TBa of the test board TB. In this case, of the plungers PR1 and PR2 constituting each probe pin PB, the plunger PR1 is located on the upper side, and the plunger PR2 is located on the lower side (side closer to the test board TB). Also, the tip portion ST1 faces upward and the tip portion ST2 faces downward (side closer to the test board TB) in each probe pin PB. The tip portion ST1 of the probe pin PB protrudes from the main surface BSa of the base portion BS of the probe unit UT, and the tip portion ST2 of the probe pin PB protrudes from the main surface BSb of the base portion BS of the probe unit UT. The tip portions ST2 of the plurality of probe pins PB included in the probe unit UT face the plurality of terminals TE of the test board TB, respectively. At this stage, it is not essential that the tip portion ST2 of the probe pin PB is in contact with (electrically connected to) the terminal TE of the test board TB, but the tip portion ST2 of the probe pin PB is in contact with and electrically connected to the terminal TE of the test board TB in the case of FIG. 4.

In the test step, first, as shown in FIG. 3 and FIG. 4, the semiconductor device PKG to be tested is arranged on the seat DZ of the socket SK of the test apparatus TS. When the semiconductor device PKG is arranged on the seat DZ, the tip portion ST1 of each probe pin PB is in a state of facing the lead LD of the semiconductor device PKG. However, since the elastic body BN is lifting the seat DZ at this stage, the seat DZ is separated from the base portion BS, and each lead LD of the semiconductor device PKG is separated from the tip portion ST1 of the probe pin PB. Therefore, at the stage of FIG. 3 and FIG. 4, each lead LD of the semiconductor device PKG is not in contact with the probe pin PB, and each lead LD of the semiconductor device PKG is not electrically connected to the probe pin PB located below the lead LD. Note that, at the stage where the semiconductor device PKG to be tested is arranged on the seat DZ as shown in FIG. 3 and FIG. 4, it is not essential that the tip portion ST2 of the probe pin PB comes into contact with (is electrically connected to) the terminal TE of the test board TB, but the tip portion ST2 of the probe pin PB is in contact with and electrically connected to the terminal TE of the test board TB in the case of FIG. 4.

Here, when the semiconductor device PKG is arranged on the seat DZ of the socket SK, the semiconductor device PKG which is a semiconductor package is in a state of being housed in the socket SK. Therefore, the position on the seat DZ in the outer frame portion FR of the socket SK can be regarded as the package housing portion of the socket SK (housing portion of the semiconductor device PKG). Therefore, arranging the semiconductor device PKG on the seat DZ of the socket SK can be regarded as arranging the semiconductor device PKG in the package housing portion of the socket SK.

Then, as shown in FIG. 5 to FIG. 7, by pushing the semiconductor device PKG toward the probe unit UT with the pressing jig (not shown) or the like, the semiconductor device PKG descends together with the seat DZ and approaches the base portion BS, so that the outer lead portion of each lead LD of the semiconductor device PKG comes into contact with and is electrically connected to the tip portion ST1 of the probe pin PB located below the lead LD. Further, when the semiconductor device PKG is pushed toward the probe unit UT by the pressing jig (not shown) or the like as shown in FIG. 5 to FIG. 7, the tip portion ST2 of each probe pin PB comes into contact with and is electrically connected to the terminal TE of the test board TB located below the probe pin PB. Therefore, when the semiconductor device PKG is pushed toward the probe unit UT, as shown in FIG. 6 and FIG. 7, the tip portion ST1 of each probe pin PB is brought into contact with the lead LD (more specifically, the plating layer PL on the surface of the lead LD) of the semiconductor device PKG, and the tip portion ST2 of each probe pin PB is brought into contact with the terminal TE of the test board TB. As a result, the lead LD of the semiconductor device PKG and the terminal TE of the test board TB are electrically connected via the probe pin PB, and the plurality of leads LD of the semiconductor device PKG is electrically connected to the test circuit formed in the test head HE via the plurality of probe pins PB and the conductor portion (including the terminal TE) of the test board TB. The tip portion ST1 of the probe pin PB has a sharp portion (in the case of FIG. 7, it has a plurality of sharp portions), and this sharp portion bites into the lead LD (more specifically, the plating layer PL on the surface of the lead LD), so that the contact resistance between the lead LD and the probe pin PB can be reduced.

In this state (state in FIG. 5 to FIG. 7), a current or voltage is supplied from the test circuit formed in the test head HE to the semiconductor chip CP of the semiconductor device PKG via the test board TB, the probe pin PB, and the lead LD, whereby the electrical test of the semiconductor device PKG can be performed. For example, by measuring the electrical characteristics of the semiconductor device PKG, the quality of the electrical characteristics of the semiconductor device PKG is tested. The probe pin PB is used as a transmission path for transmitting the current or voltage input from the terminal TE of the test board TB to the lead LD of the semiconductor device PKG.

Thereafter, the pressing force applied to the semiconductor device PKG by the pressing jig or the like is released, and the semiconductor device PKG for which the electrical test has been completed is taken out from (the package housing portion of) the socket SK. Then, after the semiconductor device PKG to be tested next is arranged on the seat DZ of the socket SK as shown in FIG. 3 and FIG. 4, the semiconductor device PKG is pushed toward the probe unit UT as shown in FIG. 5 to FIG. 7, and the electrical test of the semiconductor device PKG is performed. By repeating this, the electrical test can be sequentially performed for a plurality of semiconductor devices PKG.

When the number of semiconductor devices PKG for which the electrical test has been performed using the test apparatus TS increases, the tip portion ST1 of the probe pin PB that has been repeatedly brought into contact with the lead LD is worn away. If the wear amount of the tip portion ST1 of the probe pin PB increases, there is a fear that the contact resistance between the tip portion ST1 of the probe pin PB and the lead LD may increase, and the increase in the contact resistance may reduce the reliability of the electrical test of the semiconductor device.

In the present embodiment, when the tip portion ST1 of the probe pin PB is worn away due to repeated contact with the lead LD, the probe unit UT including a plurality of probe pins PB can be turned upside down. Hereinafter, the case where the probe unit UT including the plurality of probe pins PB is turned upside down will be described with reference to FIG. 10 to FIG. 16. FIG. 10 to FIG. 16 are cross-sectional views showing the principal part around the socket SK of the test apparatus TS in an enlarged manner. FIG. 10, FIG. 12, and FIG. 14 show cross-sections at the position corresponding to FIG. 3 and FIG. 5, and FIG. 11, FIG. 13, and FIG. 15 show cross-sections at the position corresponding to FIG. 4 and FIG. 6. FIG. 16 shows a cross-section at the position corresponding to FIG. 7.

After performing the electrical test of the semiconductor device PKG by using the test apparatus TS as shown in FIG. 3 to FIG. 7 above, the probe unit UT is removed in the test apparatus TS, and then the probe unit UT is rearranged so that the main surface BSa of the base portion BS faces the upper surface TBa of the test board TB as shown in FIG. 10 and FIG. 11. At this time, since the probe unit UT is rearranged by turning the probe unit UT upside down, the probe unit UT is housed in the opening of the outer frame portion FR and is arranged on the upper surface TBa of the test board TB, with the main surface BSa of the base portion BS facing the upper surface TBa of the test board TB as shown in FIG. 10 and FIG. 11. Namely, the main surface BSa of the base portion BS becomes the lower surface of the base portion BS, and the main surface BSb of the base portion BS becomes the upper surface of the base portion BS. Further, of the plate-shaped members BS1 and BS2 constituting the base portion BS, the member BS2 is arranged on the upper side and the member BS1 is arranged on the lower side (the side closer to the test board TB). The probe unit UT is held or fixed to the test board TB by pressing the outer peripheral portion of the main surface BSb of the base portion BS with the outer frame portion FR. Note that it is more preferable to perform cleaning treatment of the plurality of probe pins PB included in the probe unit UT after removing the probe unit UT and before rearranging the probe unit UT.

The seat DZ is arranged on the rearranged probe unit UT, that is, on the main surface BSb of the base portion BS via the elastic body BN such as a spring. The elastic body BN such as a spring is housed in a concave portion (recessed portion) KB2 provided in the main surface BSb of the base portion BS, and a part of the elastic body BN protrudes from the main surface BSb of the base portion BS and comes into contact with the lower surface of the seat DZ. The elastic body BN exerts a force for lifting the seat DZ on the seat DZ.

The position of the concave portion KB1 in the main surface BSa of the base portion BS when arranging the probe unit UT such that the main surface BSb faces the upper surface TBa of the test board TB as shown in FIG. 3 to FIG. 7 and the position of the concave portion KB2 in the main surface BSb of the base portion BS when arranging the probe unit UT such that the main surface BSa faces the upper surface TBa of the test board TB as shown in FIG. 10 to FIG. 16 are preferably the same. Namely, it is preferable that the position of the concave portion KB1 in the main surface BSa of the base portion BS and the position of the concave portion KB2 in the main surface BSb of the base portion BS become the same position when the base portion BS is turned upside down. Consequently, the relative positions of the elastic body BN with respect to the base portion BS can be made the same between the case of FIG. 3 to FIG. 7 and the case of FIG. 10 to FIG. 16. Further, it is preferable that the shape and depth of the concave portion KB1 and the shape and depth of the concave portion KB2 are the same as each other. Consequently, the shape and dimensions of the elastic body BN to be used can be made common between the case of FIG. 3 to FIG. 7 and the case of FIG. 10 to FIG. 16, and it is also possible to use the common elastic body BN between the case of FIG. 3 to FIG. 7 and the case of FIG. 10 to FIG. 16.

When the probe unit UT is turned upside down, the plurality of probe pins PB constituting the probe unit UT is also turned upside down together with the base portion BS constituting the probe unit UT. Therefore, as shown in FIG. 10 and FIG. 11, of the plungers PR1 and PR2 constituting each probe pin PB, the plunger PR2 is located on the upper side and the plunger PR1 is located on the lower side (side closer to the test board TB), and the tip portion ST2 faces upward and the tip portion ST1 faces downward (side closer to the test board TB) in each probe pin PB. The tip portion ST1 of the probe pin PB protrudes from the main surface BSa of the base portion BS of the probe unit UT, and the tip portion ST2 of the probe pin PB protrudes from the main surface BSb of the base portion BS of the probe unit UT. The tip portions ST1 of the plurality of probe pins PB included in the probe unit UT face the plurality of terminals TE of the test board TB, respectively. At this stage, it is not essential that the tip portion ST1 of the probe pin PB is in contact with (electrically connected to) the terminal TE of the test board TB, but the tip portion ST1 of the probe pin PB is in contact with and electrically connected to the terminal TE of the test board TB in the case of FIG. 11.

With the use of the test apparatus TS in which the probe unit UT has been rearranged in this way, the test step can be performed as follows.

First, as shown in FIG. 12 and FIG. 13, the semiconductor device PKG to be tested is arranged on the seat DZ of the socket SK of the test apparatus TS. Namely, the semiconductor device PKG is arranged in the package housing portion of the socket SK. When the semiconductor device PKG is arranged on the seat DZ, the tip portion ST2 of each probe pin PB is in a state of facing the lead LD of the semiconductor device PKG. However, since the elastic body BN is lifting the seat DZ at this stage, the seat DZ is separated from the base portion BS, and each lead LD of the semiconductor device PKG is separated from the tip portion ST2 of the probe pin PB. Therefore, at the stage of FIG. 12 and FIG. 13, each lead LD of the semiconductor device PKG is not in contact with the probe pin PB, and each lead LD of the semiconductor device PKG is not electrically connected to the probe pin PB located below the lead LD. Note that, at the stage where the semiconductor device PKG to be tested is arranged on the seat DZ as shown in FIG. 12 and FIG. 13, it is not essential that the tip portion ST1 of the probe pin PB comes into contact with (is electrically connected to) the terminal TE of the test board TB, but the tip portion ST1 of the probe pin PB is in contact with and electrically connected to the terminal TE of the test board TB in the case of FIG. 13.

Then, as shown in FIG. 14 to FIG. 16, by pushing the semiconductor device PKG toward the probe unit UT with the pressing jig (not shown) or the like, the semiconductor device PKG descends together with the seat DZ and approaches the base portion BS, so that the outer lead portion of each lead LD of the semiconductor device PKG comes into contact with and is electrically connected to the tip portion ST2 of the probe pin PB located below the lead LD. Further, when the semiconductor device PKG is pushed toward the probe unit UT by the pressing jig (not shown) or the like as shown in FIG. 14 to FIG. 16, the tip portion ST1 of each probe pin PB comes into contact with and is electrically connected to the terminal TE of the test board TB located below the probe pin PB. Therefore, when the semiconductor device PKG is pushed toward the probe unit UT, as shown in FIG. 15 and FIG. 16, the tip portion ST2 of each probe pin PB is brought into contact with the lead LD (more specifically, the plating layer PL on the surface of the lead LD) of the semiconductor device PKG, and the tip portion ST1 of each probe pin PB is brought into contact with the terminal TE of the test board TB. As a result, the lead LD of the semiconductor device PKG and the terminal TE of the test board TB are electrically connected via the probe pin PB, and the plurality of leads LD of the semiconductor device PKG is electrically connected to the test circuit formed in the test head HE via the plurality of probe pins PB and the test board TB. The tip portion ST2 of the probe pin PB has a sharp portion (in the case of FIG. 16, it has a plurality of sharp portions), and this sharp portion bites into the lead LD (more specifically, the plating layer PL on the surface of the lead LD), so that the contact resistance between the lead LD and the probe pin PB can be reduced.

In this state (state in FIG. 14 to FIG. 16), a current or voltage is supplied from the test circuit formed in the test head HE to the semiconductor chip CP of the semiconductor device PKG via the test board TB, the probe pin PB, and the lead LD, whereby the electrical test of the semiconductor device PKG can be performed. For example, by measuring the electrical characteristics of the semiconductor device PKG, the quality of the electrical characteristics of the semiconductor device PKG is tested.

Thereafter, the pressing force applied to the semiconductor device PKG by the pressing jig or the like is released, and the semiconductor device PKG for which the electrical test has been completed is taken out from (the package housing portion of) the socket SK. Then, after the semiconductor device PKG to be tested next is arranged on the seat DZ of the socket SK as shown in FIG. 12 and FIG. 13, the semiconductor device PKG is pushed toward the probe unit UT as shown in FIG. 14 to FIG. 16, and the electrical test of the semiconductor device PKG is performed. By repeating this, the electrical test can be sequentially performed for a plurality of semiconductor devices PKG.

<Studied Example>

Next, a test apparatus according to a studied example studied by the inventors will be described with reference to FIG. 17. FIG. 17 is a cross-sectional view showing the principal part of the test apparatus TS101 according to the studied example studied by the inventors, and it shows the cross-section at the position corresponding to FIG. 7.

In the test apparatus TS101 according to the studied example shown in FIG. 17, a probe pin PB101 is housed in a through hole TH101 of a base portion BS101 constituting a probe unit UT101. Also, a terminal TE101 on an upper surface of a test board TB101 and a lead LD101 of a semiconductor device PKG101 are electrically connected via the probe pin PB101.

The probe pin PB101 has a spring SP101 and plungers PR101 and PR102 arranged so as to face each other via the spring SP101. A tip portion ST101 of the plunger PR101, that is, one tip portion ST101 of the probe pin PB101 protrudes from an upper surface of the base portion BS101 and is brought into contact with the lead LD101 (more specifically, a plating layer PL101 on the surface of the lead LD101). Further, a tip portion ST102 of the plunger PR102, that is, the other tip portion ST102 of the probe pin PB101 protrudes from a lower surface of the base portion BS101 and is brought into contact with the terminal TE101 on the upper surface of the test board TB101. Consequently, the lead LD101 is electrically connected to the terminal TE101 of the test board TB via the probe pin PB101. A current or voltage is supplied from the test circuit to the semiconductor device PKG101 via the test board TB101 and the probe pin PB101, whereby the electrical test of the semiconductor device PKG101 is performed.

In the test apparatus TS101 of the studied example, the shape of the tip portion ST101 of the probe pin PB101 and the shape of the tip portion ST102 of the probe pin PB101 are different from each other. In the case of FIG. 17, the shape of the tip portion ST101 of the probe pin PB101 is a crown-like shape, and the shape of the tip portion ST102 of the probe pin PB101 is a conical shape (needle-like shape).

The electrical test of the semiconductor device PKG101 can be performed using the probe pin PB101 provided in the probe unit UT101, but when the number of semiconductor devices PKG101 for which the electrical test has been performed increases, the tip portion ST101 of the probe pin PB101 that has been repeatedly brought into contact with the lead LD101 is worn away. If the wear amount of the tip portion ST101 of the probe pin PB101 increases, there is a fear that the contact resistance between the tip portion ST101 of the probe pin PB101 and the lead LD101 may increase, and the increase in the contact resistance may reduce the reliability of the electrical test of the semiconductor device.

Therefore, after the electrical test of a predetermined number of semiconductor devices PKG101 has been performed using the test apparatus TS101, it is necessary to replace the probe pin PB101 included in the probe unit UT101 of the test apparatus TS101 with a new probe pin PB101. However, this will increase the manufacturing cost of the semiconductor device.

<Main Feature and Effect>

The probe pin PB of the present embodiment is a probe pin used for performing an electrical test of a semiconductor device. By electrically connecting the external terminal (here, the lead LD) of the semiconductor device PKG to the terminal TE of the test board TB via the probe pin PB, the electrical test of the semiconductor device PKG can be performed.

One of the main features of the present embodiment is that the probe pin PB has the tip portion ST1 and the tip portion ST2 which is located on opposite side of the tip portion ST1 and which has the same shape as the tip portion ST1.

As described above, in the case where the tip portion ST1 of the probe pin PB is brought into contact with the external terminal (here, the lead LD) of the semiconductor device to perform the electrical test, the tip portion ST1 of the probe pin PB that has been repeatedly brought into contact with the external terminal of the semiconductor device is worn away when the number of semiconductor devices for which the electrical test has been performed increases. If the wear amount of the tip portion ST1 of the probe pin PB increases, there is a fear that the contact resistance between the tip portion ST1 of the probe pin PB and the external terminal of the semiconductor device may increase, and the increase in the contact resistance may reduce the reliability of the electrical test of the semiconductor device.

Therefore, in the present embodiment, when the tip portion ST1 of the probe pin PB has been worn away by repeatedly contacting the tip portion ST1 of the probe pin PB with the external terminal of the semiconductor device, the probe unit UT including the plurality of probe pins PB is turned upside down, and the tip portion ST2 of the probe pin PB is brought into contact with the external terminal of the semiconductor device to perform the electrical test of the semiconductor device. Consequently, the life of the probe pin PB according to the present embodiment capable of performing the electrical test by contacting the tip portion ST1 of the probe pin PB with the external terminal of the semiconductor device and the electrical test by contacting the tip portion ST2 of the probe pin PB with the external terminal of the semiconductor device is longer than the life of the probe pin PB101 according to the studied example described above. By extending the life of the probe pin PB, the manufacturing cost of the semiconductor device can be suppressed. Note that the life of the probe pin corresponds to the number of possible electrical tests, and the long life corresponds to the large number of possible electrical tests.

Here, in the studied example shown in FIG. 17 above, it is also conceivable to turn the probe unit UT101 including the probe pin PB101 upside down when the tip portion ST101 of the probe pin PB101 is worn away by repeatedly contacting the tip portion ST101 of the probe pin PB101 with the external terminal of the semiconductor device. In this case, the electrical test of the semiconductor device is performed by contacting the tip portion ST102 of the probe pin PB101 with the external terminal of the semiconductor device and contacting the tip portion ST101 of the probe pin PB101 with the terminal TE101 on the upper surface of the test board TB101.

However, in the case of the studied example shown in FIG. 17, the shape of the tip portion ST101 of the probe pin PB101 and the shape of the tip portion ST102 of the probe pin PB101 are different from each other. Specifically, in the case of FIG. 17, the shape of the tip portion ST101 of the probe pin PB101 is a crown-like shape, and the shape of the tip portion ST102 of the probe pin PB101 is a conical shape. Consequently, the connection state of the probe pin PB101 and the external terminal of the semiconductor device tends to vary between the case in which the tip portion ST101 of the probe pin PB101 is brought into contact with the external terminal (here, the lead LD101) of the semiconductor device and the case in which the tip portion ST102 of the probe pin PB101 is brought into contact with the external terminal (here, the lead LD101) of the semiconductor device. Therefore, the connection state of the probe pin PB101 and the external terminal of the semiconductor device tends to vary between the electrical test in which the tip portion ST101 of the probe pin PB101 is brought into contact with the external terminal of the semiconductor device and the electrical test in which the tip portion ST102 of the probe pin PB101 is brought into contact with the external terminal of the semiconductor device. This makes it difficult to stably perform the electrical test of the semiconductor device, and reduces the reliability of the electrical test.

On the other hand, in the present embodiment, the tip portion ST1 and the tip portion ST2 of the probe pin PB have the same shape as each other. From another point of view, the tip portion ST1 and the tip portion ST2 of the probe pin PB have a symmetrical structure. For example, as shown in FIG. 8 to FIG. 10, when the tip portion ST1 of the probe pin PB has a crown-like shape, the tip portion ST2 of the probe pin PB also has a crown-like shape. Further, when the tip portion ST1 of the probe pin PB has a plurality of protrusions, the tip portion ST2 of the probe pin PB also has a plurality of protrusions, and the number and shape of the plurality of protrusions of the tip portion ST2 of the probe pin PB are the same as the number and shape of the plurality of protrusions of the tip portion ST1 of the probe pin PB.

As a result, the connection state of the probe pin PB and the external terminal of the semiconductor device can be made almost the same between the case in which the tip portion ST1 of the probe pin PB is brought into contact with the external terminal of the semiconductor device and the case in which the tip portion ST2 of the probe pin PB is brought into contact with the external terminal of the semiconductor device. Therefore, the connection state of the probe pin PB and the external terminal of the semiconductor device can be made almost the same between the electrical test in which the tip portion ST1 of the probe pin PB is brought into contact with the external terminal of the semiconductor device and the electrical test in which the tip portion ST2 of the probe pin PB is brought into contact with the external terminal of the semiconductor device. Therefore, it is possible to stably perform the electrical test of the semiconductor device, and to increase the reliability of the electrical test.

Further, in the present embodiment, the probe unit UT including the plurality of probe pins PB is used, and the plurality of probe pins PB is turned upside down by turning the probe unit UT upside down. Therefore, it is possible to easily turn the plurality of probe pins PB upside down, and it is possible to easily make the transition from the electrical test in which the tip portion ST1 of the probe pin PB is brought into contact with the external terminal of the semiconductor device to the electrical test in which the tip portion ST2 of the probe pin PB is brought into contact with the external terminal of the semiconductor device. Further, since the plurality of probe pins PB included in the probe unit UT is also turned upside down by turning the probe unit UT upside down, the relative positional relationship of the plurality of probe pins PB in the probe unit UT does not change before and after the probe unit UT is turned upside down. Therefore, when the probe unit UT is turned upside down, it is possible to easily align the plurality of probe pins PB with respect to the plurality of terminals TE of the test board TB, and the positions of the plurality of probe pins PB and the positions of the external terminals of the semiconductor device to be tested can be matched easily.

Here, the electrical test in which the tip portion ST1 of the probe pin PB is brought into contact with the external terminal of the semiconductor device and the tip portion ST2 of the probe pin PB is brought into contact with the terminal TE of the test board TB is referred to as the first electric test. Also, the electrical test in which the tip portion ST2 of the probe pin PB is brought into contact with the external terminal of the semiconductor device and the tip portion ST1 of the probe pin PB is brought into contact with the terminal TE of the test board TB is referred to as the second electrical test. FIG. 3 to FIG. 7 correspond to the case where the first electrical test is performed, and FIG. 10 to FIG. 16 correspond to the case where the second electrical test is performed.

First, the case in which the first electrical test is performed will be described. In the first electrical test, in the probe pin PB, the tip portion ST1 brought into contact with the external terminal of the semiconductor device is more likely to wear than the tip portion ST2 brought into contact with the terminal TE of the test board TB.

This is because there is a possibility that a coating film such as an oxide film (a film that inhibits conduction) is formed on the outermost surface of the external terminal of the semiconductor device, and the tip portion ST1 of the probe pin PB needs to penetrate the film, so that the tip portion ST1 of the probe pin PB is likely to be worn away. Further, the solder material constituting the external terminal of the semiconductor device may adhere to the tip portion ST1 of the probe pin PB in some cases, and the tip portion ST1 of the probe pin PB must be cleaned in such a case by performing the cleaning treatment for the tip portion ST1 of the probe pin PB. However, there is a risk that the tip portion ST1 of the probe pin PB will be worn during the cleaning treatment. When the external terminal is the lead LD mentioned above, the solder material constituting the external terminal corresponds to the plating layer PL, and when the external terminal is the solder ball or the solder bump, the solder material constituting the external terminal corresponds to the solder material constituting the solder ball or the solder bump. Further, since it is desirable that the external terminal of the semiconductor device (here, the lead LD) is formed of a metal material suitable for the external terminal of the semiconductor device, it is difficult to select the metal material capable of suppressing the wear of the tip portion ST1 of the probe pin PB as the metal material for the external terminal of the semiconductor device. Therefore, when the first electrical test is performed, it is difficult to suppress the wear of the tip portion ST1 of the probe pin PB due to the contact with the external terminal of the semiconductor device.

On the other hand, when the first electrical test is performed, the wear of the tip portion ST2 of the probe pin PB due to the contact with the terminal TE of the test board TB can be easily suppressed. This is because the terminal TE of the test board TB is used for the electrical test, but is not used when the semiconductor device is used, and thus, the metal material capable of suppressing the wear of the tip portion of the probe pin PB to be in contact with the terminal TE can be easily selected as the external terminal TE of the test board TB. For example, gold (Au) can be preferably used as the material of the terminal TE of the test board TB. As a result, the connection resistance between the terminal TE of the test board TB and the probe pin PB can be reduced, and the wear of the tip portion ST2 of the probe pin PB due to the contact with the terminal TE of the test board TB can be suppressed. Further, since the terminal TE of the test board TB does not contain the solder material, the solder material does not adhere to the tip portion ST2 of the probe pin PB in contact with the terminal TE of the test board TB, and therefore, it is not necessary to apply the cleaning treatment associated with the adhesion of the solder material to the tip portion ST2 of the probe pin PB, and it is possible to avoid the concern that the tip portion ST2 of the probe pin PB is worn by the cleaning treatment. From this point of view, it is easy to suppress the wear of the tip portion ST2 of the probe pin PB due to the contact with the terminal TE of the test board TB. Further, when testing a plurality of semiconductor devices, the contact of the tip portion ST1 of the probe pin PB to the external terminal of the semiconductor device is repeated, but the tip portion ST2 of the probe pin PB can be kept in contact with the terminal TE of the test board TB at all times. Therefore, the wear of the tip portion ST2 of the probe pin PB can be easily suppressed as compared with the tip portion ST1 of the probe pin PB that is repeatedly contacted with the external terminal of the semiconductor device.

Therefore, in the first electrical test performed by contacting the tip portion ST1 of the probe pin PB with the external terminal of the semiconductor device and contacting the tip portion ST2 of the probe pin PB with the terminal TE of the test board TB, the tip portion ST1 of the probe pin PB which is brought into contact with the external terminal of the semiconductor device is more likely to be worn away than the tip portion ST2 of the probe pin PB which is brought into contact with the terminal TE of the test board TB.

Therefore, as the number of semiconductor devices for which the first electrical test has been performed increases, the tip portion ST1 of the probe pin PB which has been repeatedly contacted with the external terminal of the semiconductor device is considerably worn away. By comparison, the wear of the tip portion ST2 of the probe pin PB is suppressed to some extent. Namely, the wear amount of the tip portion ST1 of the probe pin PB is larger than the wear amount of the tip portion ST2 of the probe pin PB. When the wear amount of the tip portion ST1 of the probe pin PB becomes large in the case where a coating film such as an oxide film is formed on the surface of the external terminal of the semiconductor device, it becomes difficult for the tip portion ST1 of the probe pin PB to penetrate the film, and the connection resistance between the external terminal of the semiconductor device and the tip portion ST1 of the probe pin PB becomes large. This leads to the decrease in reliability of the electrical test of the semiconductor device.

Therefore, after the first electrical test in which the tip portion ST1 of the plunger PR1 is brought into contact with the external terminal (lead LD) of the semiconductor device is performed for a certain number of semiconductor devices, the probe unit UT including the plurality of probe pins PB is turned upside down to make a transition to the second electrical test. In this case, the transition from the electrical test performed by contacting the tip portion ST1 of the probe pin PB having a large wear amount with the external terminal of the semiconductor device to the electrical test performed by contacting the tip portion ST2 of the probe pin PB having a smaller wear amount than the tip portion ST1 with the external terminal of the semiconductor device is made. Since the electrical test of the semiconductor device is performed by contacting the tip portion ST2 of the probe pin PB having a small wear amount with the external terminal of the semiconductor device, the life of the probe pin PB is extended, and the number of the electrical tests of the semiconductor device that can be performed without replacing the probe pin PB can be increased. Therefore, the manufacturing cost of the semiconductor device can be suppressed.

On the other hand, in the electrical test performed by contacting the tip portion ST2 of the probe pin PB having a small wear amount with the external terminal of the semiconductor device, the tip portion ST1 of the probe pin PB having a large wear amount comes into contact with the terminal TE of the test board TB. As described above, when the tip portion ST1 of the probe pin PB having a large wear amount is brought into contact with the external terminal of the semiconductor device, there is a concern that the connection resistance between the tip portion ST1 of the probe pin PB and the external terminal of the semiconductor device increases. However, when the tip portion ST1 of the probe pin PB having a large wear amount is brought into contact with the terminal TE of the test board TB, there is less concern that the connection resistance between the tip portion ST1 of the probe pin PB and the terminal TE of the test board TB increases. The reason is as follows.

That is, when the tip portion ST1 of the probe pin PB having a large wear amount is brought into contact with the external terminal of the semiconductor device, the tip portion ST1 of the probe pin PB cannot penetrate the coating film (oxide film, etc.) on the surface of the external terminal, and there is a concern that the connection resistance between the external terminal of the semiconductor device and the tip portion ST1 of the probe pin PB increases. On the other hand, a coating film such as an oxide film is unlikely to be formed on the surface of the terminal TE of the test board TB. Further, when testing a plurality of semiconductor devices, the tip portion ST1 of the probe pin PB can be kept in contact with the terminal TE of the test board TB at all times. Therefore, when the tip portion ST1 of the probe pin PB is brought into contact with the terminal TE of the test board TB, the tip portion ST1 of the probe pin PB does not need to penetrate the coating film on the surface of the terminal TE, and thus the connection resistance between the terminal TE of the test board TB and the tip portion ST1 of the probe pin PB can be suppressed even when the wear amount of the tip portion ST1 of the probe pin PB is large.

Therefore, in the second electrical test performed by contacting the tip portion ST2 of the probe pin PB with the external terminal of the semiconductor device and contacting the tip portion ST1 of the probe pin PB with the terminal TE of the test board TB, the problem hardly occurs even when the wear amount of the tip portion ST1 of the probe pin PB is large.

Therefore, in the present embodiment, after the first electrical test in which the tip portion ST1 of the probe pin PB is brought into contact with the external terminal of the semiconductor device, the second electrical test in which the tip portion ST2 of the probe pin PB is brought into contact with the external terminal of the semiconductor device is performed, whereby the tip portion of the probe pin PB having a small wear amount can be brought into contact with the external terminal of the semiconductor device. Consequently, the life of the probe pin PB is extended, and the number of the electrical tests of the semiconductor device that can be performed without replacing the probe pin PB can be increased. Therefore, the manufacturing cost of the semiconductor device can be suppressed.

Further, in the present embodiment, the tip portion ST1 and the tip portion ST2 of the probe pin PB have the same shape. In the case of FIG. 7 to FIG. 9 mentioned above, both the tip portion ST1 and the tip portion ST2 of the probe pin PB have a crown-like shape. As another aspect, the tip portion ST1 and the tip portion ST2 of the probe pin PB may have a shape other than the crown-like shape, but even in that case, the tip portion ST1 and the tip portion ST2 of the probe pin PB have the same shape. FIG. 18 is a side view showing a modification of the probe pin PB, and corresponds to FIG. 8 mentioned above. In the case of FIG. 18, the shape of both the tip portion ST1 and the tip portion ST2 of the probe pin PB is the conical shape (needle shape).

However, when the tip portions ST1 and ST2 of the probe pin PB have a conical shape, the external terminal of the semiconductor device (or the terminal of the test board) and the tip portion of the probe pin PB come into contact at one point. Meanwhile, when the tip portions ST1 and ST2 of the probe pin PB have a crown-like shape, the external terminal of the semiconductor device (or the terminal of the test board) and the tip portion of the probe pin PB come into contact at multiple points. Therefore, considering the connectivity between the external terminal of the semiconductor device (or the terminal of the test board) and the probe pin PB, it is more preferable that the tip portions ST1 and ST2 of the probe pin PB have a crown-like shape rather than a conical shape.

Further, in the present embodiment, the case where the lead is applied as the external terminal of the semiconductor device with which the probe pin PB is brought into contact has been described as an example. As another aspect, a ball electrode (bump electrode) such as a solder ball (solder bump) can be applied as the external terminal of the semiconductor device with which the probe pin PB is brought into contact, in addition to the lead. Therefore, the semiconductor device to be tested may be a BGA (Ball Grid Array) semiconductor package or the like.

The invention made by the inventors has been specifically described above based on the embodiment thereof, but it is needless to say that the present invention is not limited to the embodiment described above and can be variously modified within the range not departing from the gist thereof.

What is claimed is:

1. A method of manufacturing a semiconductor device, comprising:
   (a) preparing a test apparatus provided with following (a1), (a2) and (a3):
      (a1) a test board having a terminal,
      (a2) a unit having a first surface and a second surface opposite the first surface, the unit being arranged such that the second surface faces the test board, and
      (a3) a probe pin including a first tip portion and a second tip portion having the same shape as the first tip portion, the second tip portion being located on opposite side of the first tip portion, and the probe pin being housed in the unit such that the first tip portion protrudes from the first surface and such that the second tip portion protrudes from the second surface;
   (b) preparing a first semiconductor package having a first external terminal;
   (c) after the (a) and the (b), bringing the first external terminal of the first semiconductor package into contact with the first tip portion of the probe pin and bringing the second tip portion of the probe pin into contact with the terminal of the test board, thereby performing an electrical test of the first semiconductor package;
   (d) after the (c), in the test apparatus, removing the unit, and rearranging the unit such that the first surface faces the test board;
   (e) preparing a second semiconductor package having a second external terminal; and
   (f) after the (d) and the (e), bringing the second external terminal of the second semiconductor package into contact with the second tip portion of the probe pin and bringing the first tip portion of the probe pin into contact with the terminal of the test board, thereby performing an electrical test of the second semiconductor package.

2. The method of manufacturing the semiconductor device according to claim 1,
   wherein the first semiconductor package includes a first semiconductor chip electrically connected to the first external terminal, wherein the second semiconductor package includes a second semiconductor chip electrically connected to the second external terminal, wherein, in the (c), a current or voltage is supplied to the first semiconductor chip via the test board, the probe pin, and the first external terminal, and wherein, in the (f), a current or voltage is supplied to the second semiconductor chip via the test board, the probe pin, and the second external terminal.

3. The method of manufacturing the semiconductor device according to claim 2, wherein the test apparatus includes a socket configured to be arranged on the test board and house the unit, wherein the socket has a package housing portion, wherein the (c) includes:
 (c1) after the (a) and the (b), arranging the first semiconductor package in the package housing portion of the socket;
 (c2) after the (c1), pushing the first semiconductor package toward the unit, thereby bringing the first external terminal of the first semiconductor package into contact with the first tip portion of the probe pin and bringing the second tip portion of the probe pin into contact with the terminal of the test board, and further supplying a current or voltage to the first semiconductor chip via the test board, the probe pin, and the first external terminal, thereby performing the electrical test of the first semiconductor package; and
 (c3) after the (c2), taking out the first semiconductor package from the package housing portion of the socket, and wherein the (f) includes:
 (f1) after the (d) and the (e), arranging the second semiconductor package in the package housing portion of the socket;
 (f2) after the (f1), pushing the second semiconductor package toward the unit, thereby bringing the second external terminal of the second semiconductor package into contact with the second tip portion of the probe pin and bringing the first tip portion of the probe pin into contact with the terminal of the test board, and further supplying a current or voltage to the second semiconductor chip via the test board, the probe pin, and the second external terminal, thereby performing the electrical test of the second semiconductor package; and
 (f3) after the (f2), taking out the second semiconductor package from the package housing portion of the socket.

4. The method of manufacturing the semiconductor device according to claim 1, wherein a plating layer made of a solder material is formed on each surface of the first external terminal and the second external terminal.

5. The method of manufacturing the semiconductor device according to claim 1, wherein the unit has a through hole, and wherein the probe pin is housed in the through hole of the unit.

6. The method of manufacturing the semiconductor device according to claim 5, wherein the unit includes a first plate-shaped member and a second plate-shaped member laminated on each other, and wherein the through hole penetrates the first plate-shaped member and the second plate-shaped member.

7. The method of manufacturing the semiconductor device according to claim 1, wherein the test board includes a plurality of the terminals, wherein the first semiconductor package includes a plurality of the first external terminals, wherein the second semiconductor package includes a plurality of the second external terminals, wherein the unit houses a plurality of the probe pins, wherein, in the (c), the plurality of first external terminals of the first semiconductor package is brought into contact with the first tip portions of the plurality of probe pins, respectively, and the second tip portions of the plurality of probe pins are brought into contact with the plurality of terminals of the test board, respectively, thereby performing the electrical test of the first semiconductor package, and wherein, in the (f), the plurality of second external terminals of the second semiconductor package is brought into contact with the second tip portions of the plurality of probe pins, respectively, and the first tip portions of the plurality of probe pins is brought into contact with the plurality of terminals of the test board, respectively, thereby performing the electrical test of the second semiconductor package.

8. The method of manufacturing the semiconductor device according to claim 7, wherein the unit has a plurality of the through holes, and wherein the plurality of probe pins is housed in the plurality of through holes of the unit, respectively.

9. The method of manufacturing the semiconductor device according to claim 1, wherein the (d) includes:
 (d1) taking out the unit from the test apparatus;
 (d2) after the (d1), cleaning the probe pin; and
 (d3) after the (d2), rearranging the unit such that the first surface faces the test board.

10. The method of manufacturing the semiconductor device according to claim 1, wherein the (d) is performed in a state where a wear amount of the second tip portion of the probe pin is smaller than a wear amount of the first tip portion of the probe pin.

11. The method of manufacturing the semiconductor device according to claim 1, wherein each of the first tip portion and the second tip portion of the probe pin has a crown-like shape.

12. The method of manufacturing the semiconductor device according to claim 1, wherein the probe pin includes a first plunger having the first tip portion, a second plunger having the second tip portion, and an elastic body interposed between the first plunger and the second plunger.

13. The method of manufacturing the semiconductor device according to claim 1, wherein the terminal includes a gold film.

14. A method of manufacturing a semiconductor device, comprising:
 (a) preparing a test apparatus provided with following (a1), (a2) and (a3):
  (a1) a test board having a plurality of terminals,
  (a2) a unit having a first surface and a second surface opposite the first surface, the unit being arranged such that the second surface faces the test board, and
  (a3) a plurality of probe pins each including a first tip portion and a second tip portion that are located on opposite side to each other and that have the same shape as each other, and each of the plurality of probe pins being housed in the unit such that the first tip portion protrudes from the first surface and the second tip portion protrudes from the second surface;

(b) preparing a first semiconductor package having a plurality of first external terminals;

(c) after the (a) and the (b), bringing the plurality of first external terminals of the first semiconductor package into contact with the first tip portion of the plurality of probe pins, respectively, and bringing the second tip portion of the plurality of probe pins into contact with the plurality of terminals of the test board, respectively, thereby performing an electrical test of the first semiconductor package;

(d) after the (c), in the test apparatus, removing the unit, and rearranging the unit such that the first surface faces the test board;

(e) preparing a second semiconductor package having a plurality of second external terminals; and (f) after the (d) and the (e), bringing the plurality of second external terminals of the second semiconductor package into contact with the second tip portion of the plurality of probe pins, respectively, and bringing the first tip portion of the plurality of probe pins into contact with the plurality of terminals of the test board, respectively, thereby performing an electrical test of the second semiconductor package.

15. The method of manufacturing the semiconductor device according to claim 14, wherein the unit has a plurality of through holes, and wherein the plurality of probe pins is housed in the plurality of through holes of the unit, respectively.

16. The method of manufacturing the semiconductor device according to claim 15, wherein the (d) is performed in a state where a wear amount of each of the second tip portions of the plurality of probe pins is smaller than a wear amount of each of the first tip portions of the plurality of probe pins.

* * * * *